(12) United States Patent
Fedorovskaya et al.

(10) Patent No.: US 8,361,544 B2
(45) Date of Patent: Jan. 29, 2013

(54) THIN FILM ELECTRONIC DEVICE FABRICATION PROCESS

(75) Inventors: Elena A. Fedorovskaya, Pittsford, NY (US); John R. Fyson, Hackney (GB); John A. Agostinelli, Rochester, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/309,621

(22) Filed: Dec. 2, 2011

(65) Prior Publication Data

US 2012/0076929 A1    Mar. 29, 2012

Related U.S. Application Data

(63) Continuation of application No. 11/861,442, filed on Sep. 26, 2007, now abandoned.

(51) Int. Cl.
*B05B 5/00* (2006.01)
*B05D 5/12* (2006.01)

(52) U.S. Cl. ..................... 427/160; 427/126.4

(58) Field of Classification Search ............ 427/66
See application file for complete search history.

(56) References Cited

U.S. PATENT DOCUMENTS

| | | | |
|---|---|---|---|
| 4,413,022 A | 11/1983 | Suntola et al. | |
| 4,476,292 A | 10/1984 | Ham et al. | |
| 4,769,292 A | 9/1988 | Tang et al. | |
| 4,877,697 A | 10/1989 | Vollmann et al. | |
| 5,120,622 A | 6/1992 | Hanrahan | |
| 5,247,190 A | 9/1993 | Friend et al. | |
| 5,981,970 A | 11/1999 | Dimitrakopoulos et al. | |
| 5,999,321 A | 12/1999 | Bradley | |
| 6,226,890 B1 | 5/2001 | Boroson et al. | |
| 6,268,695 B1 | 7/2001 | Affinito | |
| 6,342,970 B1 | 1/2002 | Sperger et al. | |
| 6,413,645 B1 | 7/2002 | Graff et al. | |
| 6,522,067 B1 | 2/2003 | Graff et al. | |

(Continued)

FOREIGN PATENT DOCUMENTS

| | | |
|---|---|---|
| EP | 1 674 890 | 6/2006 |
| EP | 1 674 890 A2 | 6/2006 |

(Continued)

OTHER PUBLICATIONS

Wright et al.; Double Layer Anti-Reflective Coatings for Silicon Solor Cells; 2005 IEEE, pp. 1237-1240.

(Continued)

*Primary Examiner* — Nathan Empie
*Assistant Examiner* — Austin Murata
(74) *Attorney, Agent, or Firm* — William R. Zimmerli

(57) ABSTRACT

A thin film electronic device fabrication process includes providing an electronic device on a substrate, a first reactant gaseous material, a second reactant gaseous material, an inert gaseous material; and a delivery head through which the reactant gaseous materials and the inert gaseous material are simultaneously directed toward the electronic device and the substrate. One or more of the reactant gaseous materials and the inert gaseous material flows through the delivery head. The flow of the one or more of the reactant gaseous materials and the inert gaseous material generates a pressure to create a gas fluid bearing that maintains a substantially uniform distance between the delivery head and the substrate. Relative motion between the delivery head and the substrate causes the second reactant gaseous material to react with at least a portion of the electronic device and the substrate that has been treated with the first reactant gaseous material.

18 Claims, 34 Drawing Sheets

U.S. PATENT DOCUMENTS

| | | | |
|---|---|---|---|
| 6,821,563 | B2 | 11/2004 | Yudovsky |
| 6,859,323 | B1 | 2/2005 | Gasloli et al. |
| 2003/0143319 | A1* | 7/2003 | Park et al. .................. 427/64 |
| 2004/0065255 | A1* | 4/2004 | Yang et al. .................. 118/715 |
| 2005/0084610 | A1 | 4/2005 | Selitser .................. 427/248.1 |
| 2005/0217580 | A1 | 10/2005 | DeDontney et al. .......... 118/715 |
| 2005/0239297 | A1 | 10/2005 | Senzaki et al. |
| 2005/0271812 | A1* | 12/2005 | Myo et al. .................. 427/248.1 |
| 2006/0109397 | A1 | 5/2006 | Anandan .................. 349/69 |
| 2006/0214154 | A1 | 9/2006 | Yang et al. |
| 2006/0246811 | A1 | 11/2006 | Winters et al. |
| 2007/0077356 | A1 | 4/2007 | Mieno |
| 2007/0099356 | A1 | 5/2007 | Park et al. |
| 2007/0123133 | A1 | 5/2007 | Winters |

FOREIGN PATENT DOCUMENTS

| | | | |
|---|---|---|---|
| EP | 1674890 | * | 6/2006 |
| JP | 2004176081 | | 6/2004 |
| WO | WO 01/82390 | | 11/2001 |
| WO | WO 2004/105149 | | 12/2004 |

OTHER PUBLICATIONS

Tang et al.; Organic electroluminescent diodes; Appl. Phys. Lett. 51 (12), Sep. 21, 1987, pp. 913-915.

Tang et al.; Electroluminescence of doped organic thin films; J. Appl. Phys. 65 (9), May 1, 1989, pp. 3610-3616.

Park et al.; Ultrathin Film Encapsulation of an OLED by ALD; Electrochemical and Solid-State Letters, 8 (2) (2005), pp. H21-H23.

Graff et al.; Mechanisms of vapor permeation through multilayer barrier films: Lag time versus equilibrium permeation; Journal of Applied Physics, vol. 96, No. 4, Aug. 15, 2004, pp. 1840-1849.

Weaver et al.; Organic light-emitting devices with extended operating lifetimes on plastic substrates; Applied Physics Letters, vol. 81, No. 16, Oct. 14, 2002, pp. 2929-2931.

* cited by examiner

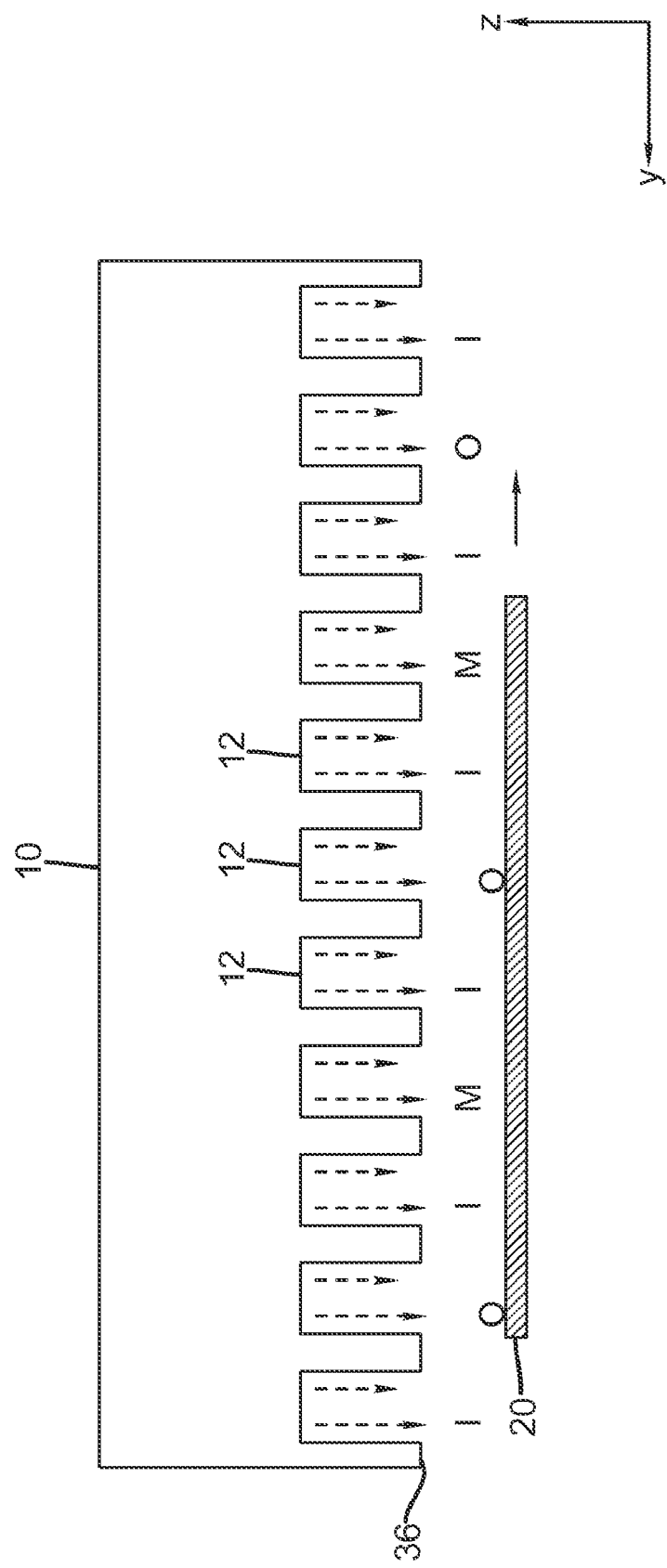

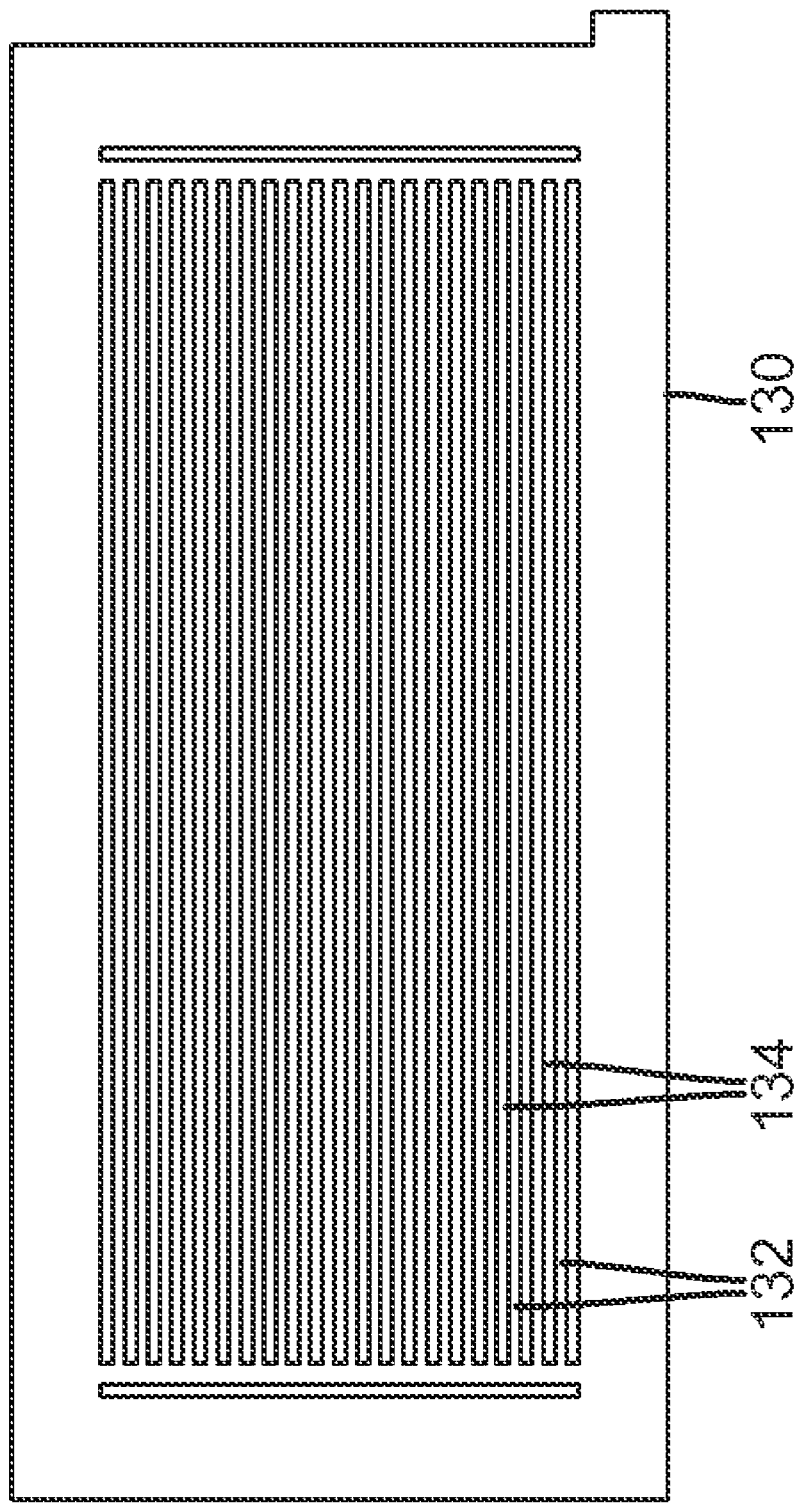

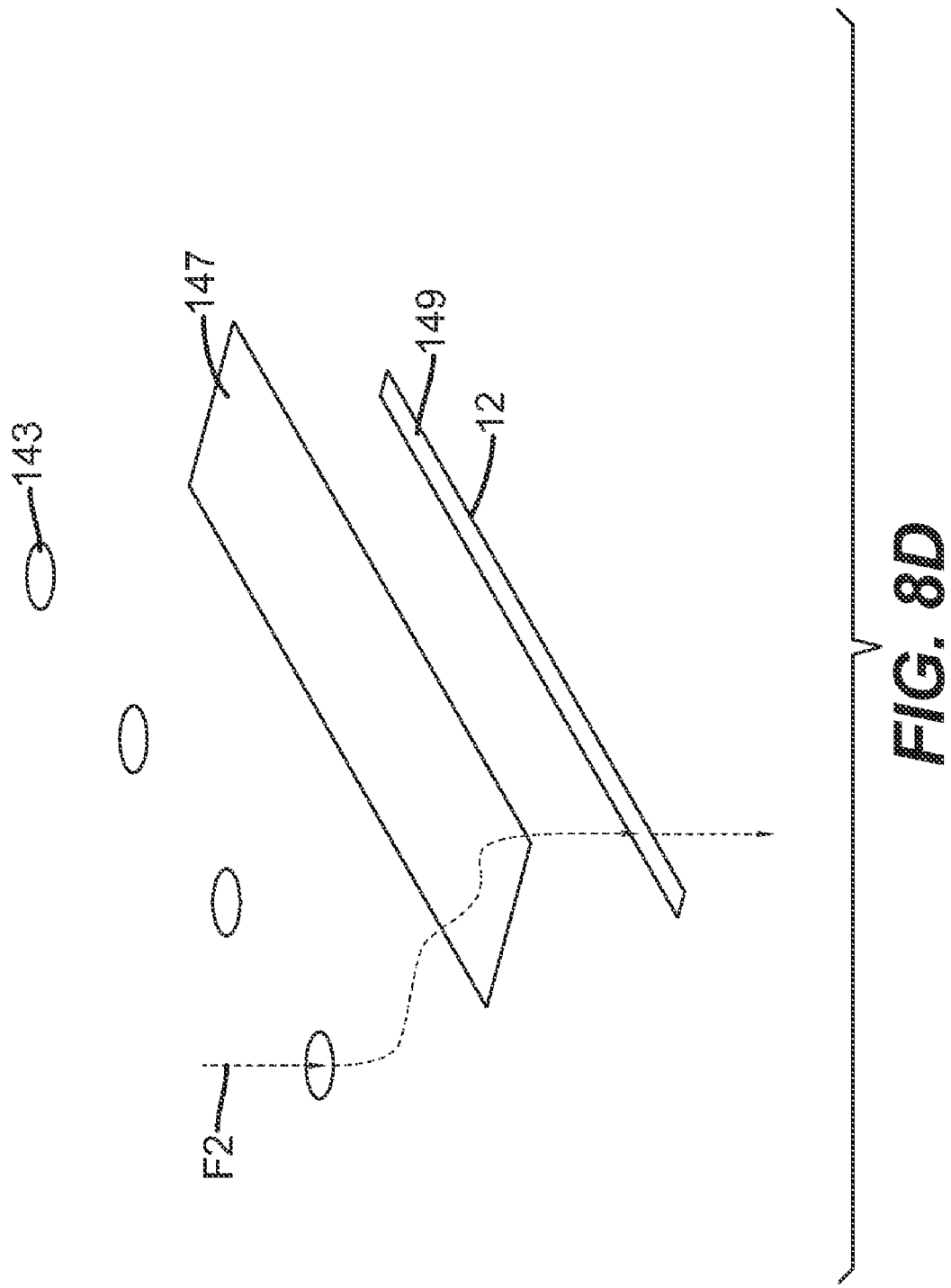

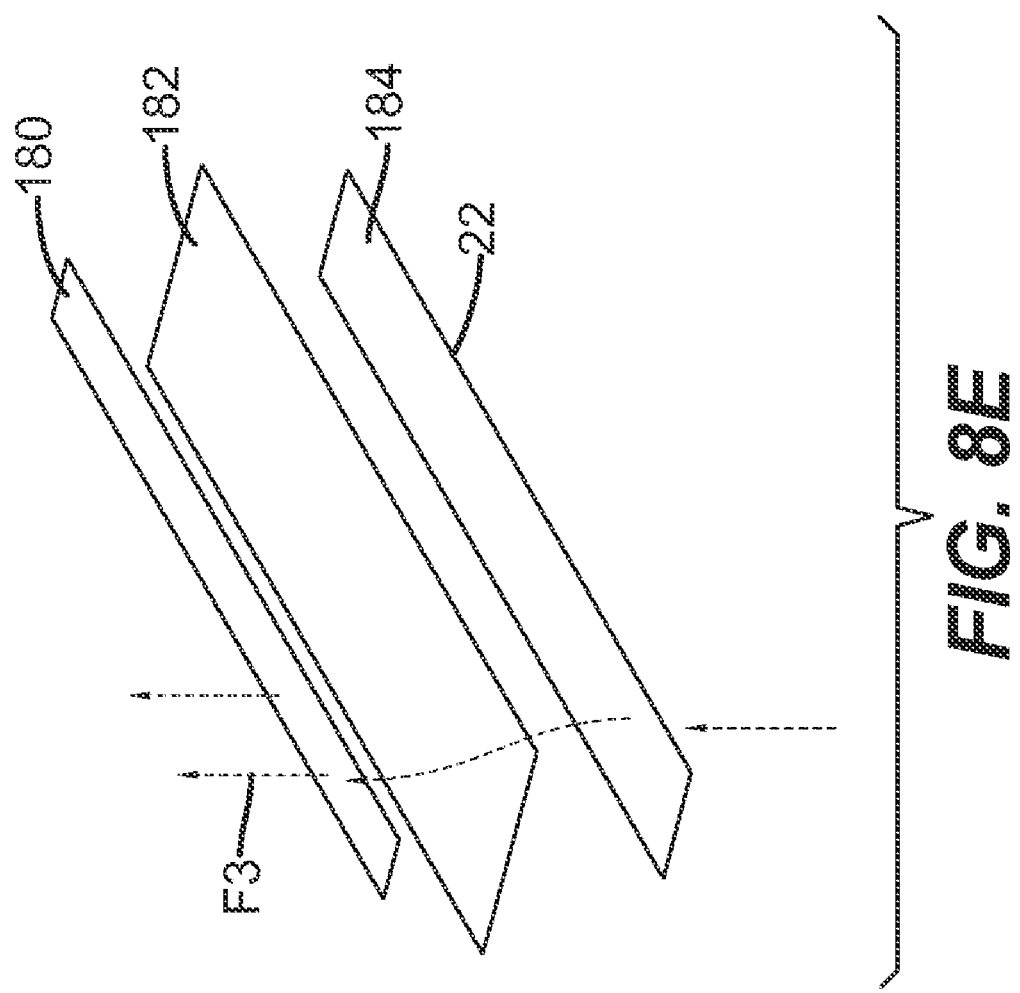

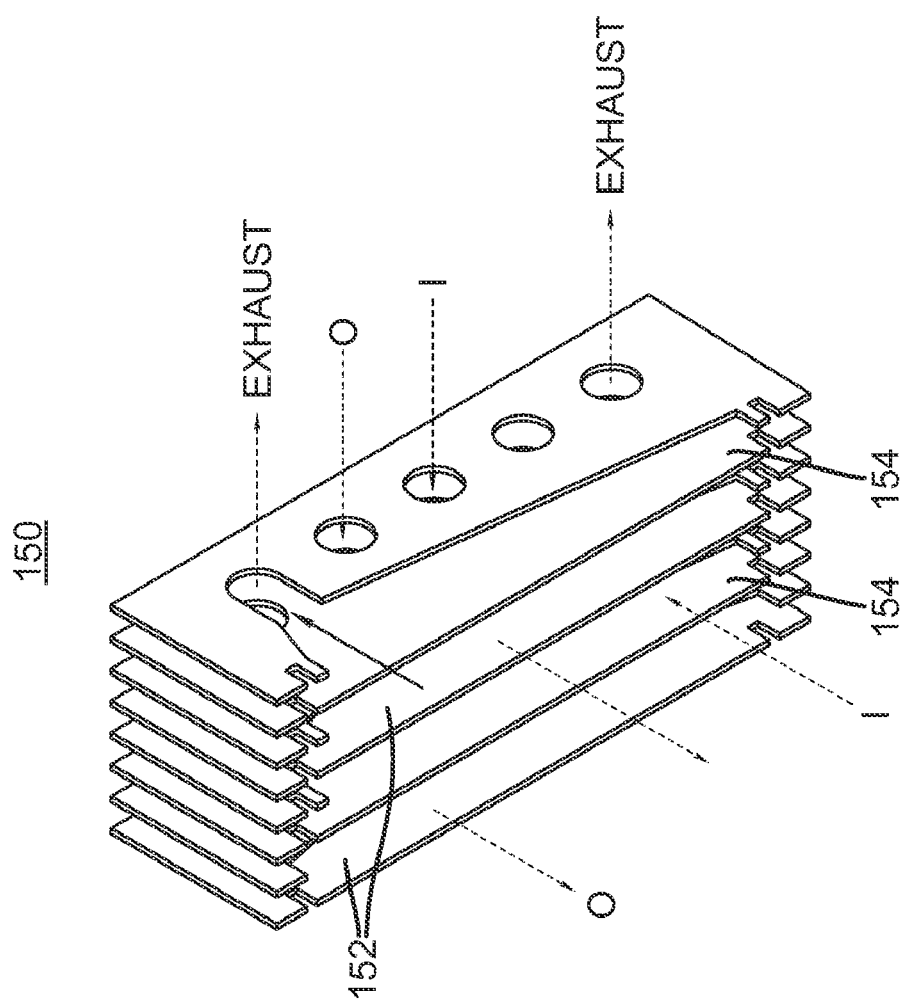

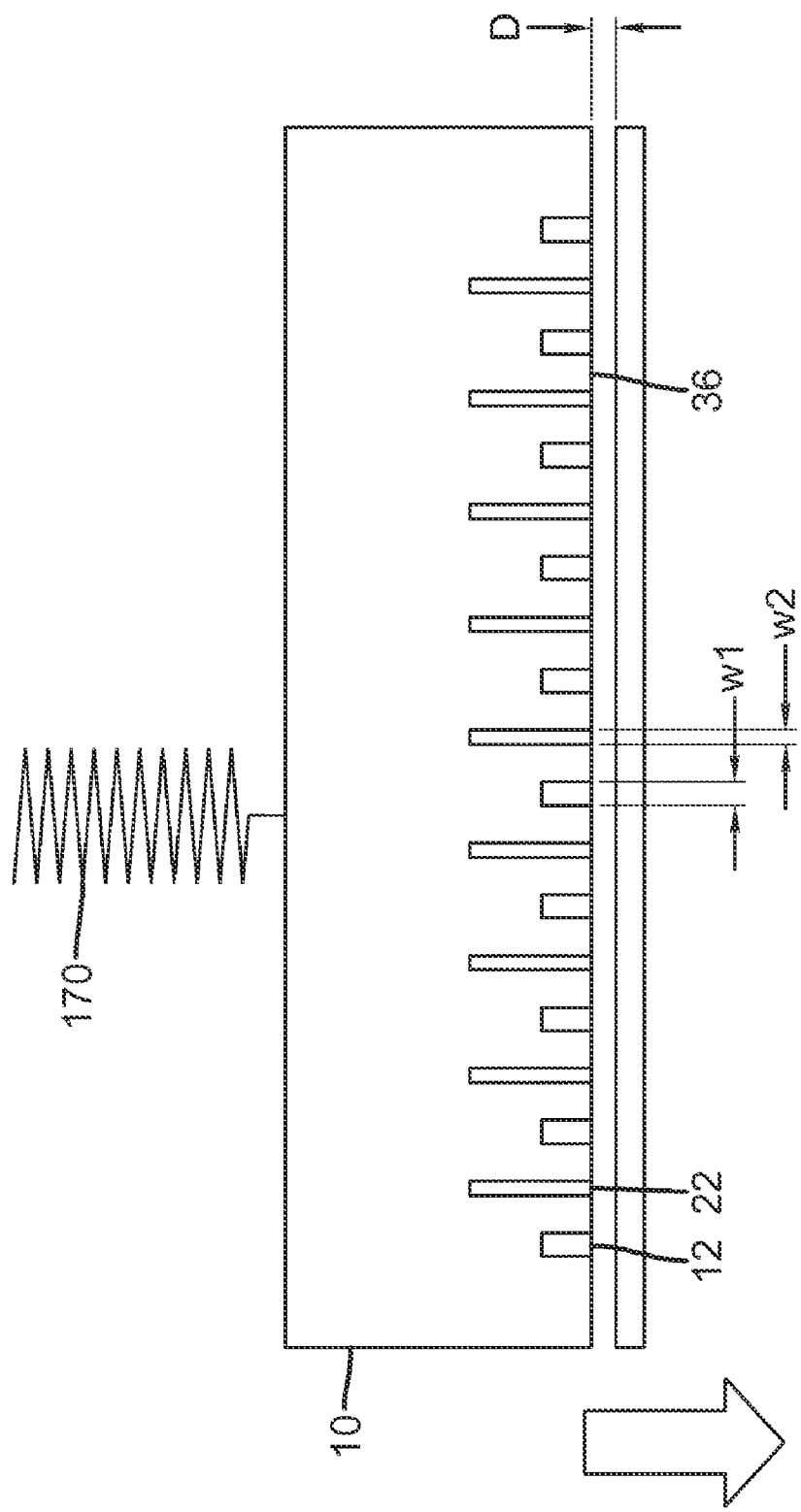

THIN FILM ELECTRONIC DEVICE FABRICATION PROCESS

CROSS REFERENCE TO RELATED APPLICATIONS

This is a continuation application of U.S. patent application Ser. No. 11/861,442 filed Sep. 26, 2007, now abandoned.

Reference is made to commonly-assigned copending U.S. patent application Ser. No. 11/392,007, filed Mar. 29, 2006, by David Levy, entitled PROCESS FOR ATOMIC LAYER DEPOSITION; U.S. patent application Ser. No. 11/392,006, filed Mar. 29, 2006, by David Levy, entitled APPARATUS FOR ATOMIC LAYER DEPOSITION; U.S. patent application Ser. No. 11/620,744, by David Levy, entitled DEPOSITION SYSTEM AND METHOD USING A DELIVERY HEAD SEPARATED FROM A SUBSTRATE BY GAS PRESSURE; and U.S. patent application Ser. No. 11/620,740, by Nelson et al. entitled DELIVERY DEVICE COMPRISING GAS DIFFUSER FOR THIN FILM DEPOSITION; the disclosures of which are incorporated herein.

FIELD OF THE INVENTION

This invention generally relates to thin film devices and components, such as electronic light emitting displays, sensor arrays, and other electronic devices, environmental barrier layers, optical thin film layers, where thin-film layers are made by vapor deposition and specifically, by atmospheric pressure atomic layer deposition process. In particular, the present invention relates to a process for making thin film material layers such as optical coating layers, color filter layers, and protective thin film material layers which can be used in electronic devices, particularly in displays for improving light output and lifetime.

BACKGROUND OF THE INVENTION

Thin film materials are utilized in a variety of applications. Examples include research and development and production applications, particularly in the fields of compound semiconductor, displays, LED, optical components, and ophthalmic devices. Thin film materials are also used to create custom coatings and patterned substrates for sensors, flat panel displays, micro-electro mechanical systems (MEMS), microcircuits, biomedical devices, optical instruments, microwave communications, integrated circuits, and microelectronics in general.

An optical coating is a thin layer of material placed on the device or optical component such as for example, a lens, a display or a sensor, which changes the way light rays are reflected and transmitted. One type is the high-reflector coating used to produce mirrors which reflect greater than 99% of the incident light. Another type of optical coating is an anti-reflection coating, which reduces unwanted reflections from surfaces, and is commonly used on spectacle and photographic lenses. Multiple layer anti-reflection coatings, such as for example, a double layer anti-reflection coating consisting of SiN, or SiN and SiO2, can be used for high efficiency solar cells, as described by Wright et al. (Solar Energy Materials & Solar Cells, 79, 2003). This type of optical coating blocks the ultraviolet light while transmitting visible light.

Complex optical coatings exhibit high reflection over some range of wavelengths, and anti-reflection over another range, allowing the production of dichroic thin-film optical filters, such as described for example in U.S. Pat. No. 6,859,323 (Gasloli et al.).

An interference filter is an optical filter that reflects one or more spectral bands and transmits others, while maintaining a nearly zero coefficient of absorption for all wavelengths of interest. Such optical filters consist of multiple layers of coatings (usually dielectric or metallic layers) on a substrate, which have different refractive indices and whose spectral properties are the result of wavelength interference effects that take place between the incident and reflected light of different wavelengths at the thin film boundaries.

Interference filters can be used a color filters and in arrays, as color filter arrays to modify and control composition of reflected and transmitted light for displays, optical waveguides, optical switches, light sensors in the back of the cameras, etc. An example of such a multilayer thin film color filter is described in the U.S. Pat. No. 5,999,321 (Bradley), which is incorporated herein by reference. In electronic devices, color filters are organized as color filter arrays (CFA). In sensors such as those used in cameras, the CFA is used in front of a panchromatic sensor to allow the detection of colored signals. The CFAs are usually an array of red, green and blue areas laid down in a pattern. A common array used in digital cameras is the Bayer pattern array. The resolution of each color is reduced by as little as possible through the use of a 2×2 cell, and, of the three colors, green is the one chosen to be sensed twice in each cell as it is the one to which the eye is most sensitive.

Similar arrays can be used in displays, wherein the CFA is placed in register in front of white light pixels to allow the viewing of color information. For example U.S. Pat. No. 4,877,697 (Vollmann et al.) describes arrays for liquid crystal displays (LCD) and U.S. Patent Application Publication No. 2007/0123133 (Winters) describes an array for an OLED device.

The arrays can be made in many ways, including inkjetting colored inks, using photolithography to pattern different colored materials in a desired fashion, etc. Color filter arrays can also be constructed as patterns of interference (or dichroic) filters. For example, U.S. Pat. No. 5,120,662 (Hanrahan) describes a method of using the photolithography technique, where two different photoresist material layers are deposited, exposed and developed to pattern the substrate for subsequent deposition of the dielectric layers, followed by removing unwanted material using a lift off process.

A method of creating a dielectric interference filter system for an LCD display and a CCD array is described in the U.S. Pat. No. 6,342,970 (Sperger et al.). According to the method, different filter elements are prepared using substrate coating, masking via, for example, lithography process, plasma etching and lift off techniques.

Organic light-emitting diodes (OLEDs) are a technology for flat-panel displays and area illumination lamps. The technology relies upon thin-film layers of organic materials coated upon a substrate. OLED devices generally can have two formats known as small-molecule devices such as disclosed in U.S. Pat. No. 4,476,292 (Ham et al.) and polymer OLED devices such as disclosed in U.S. Pat. No. 5,247,190 (Friend et al.). Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Applied Physics Letter, 913 (1987), Journal of Applied Physics, 65, 3610 (1989) and U.S. Pat. No. 4,769,292) demonstrated highly efficient OLEDs using such a layer structure. Since then, numerous OLEDs with alternative layer structures, including polymeric materials, have been disclosed and device performance has been improved. However, the materials comprising the organic EL element are sensitive and, in particular, are easily destroyed by moisture and high temperatures (for example greater than 140 degrees C.).

Organic light-emitting diode (OLED) display devices typically require humidity levels below about 1000 parts per million (ppm) to prevent premature degradation of device performance within a specified operating and/or storage life of the device. Control of the environment to this range of humidity levels within a packaged device is typically achieved by encapsulating the device with an encapsulating layer and/or by sealing the device, and/or providing a desiccant within a cover. Desiccants such as, for example, metal oxides, alkaline earth metal oxides, sulfates, metal halides, and perchlorates are used to maintain the humidity level below the above-specified level. See, for example, U.S. Pat. No. 6,226,890 (Boroson et al.) describing desiccant materials for moisture-sensitive electronic devices. Such desiccating materials are typically located around the periphery of an OLED device or over the OLED device itself.

In alternative approaches, an OLED device is encapsulated using thin multilayer coatings of moisture-resistant material. For example, layers of inorganic materials such as metals or metal oxides separated by layers of an organic polymer may be used. Such coatings have been described in, for example, U.S. Pat. No. 6,268,695 (Affinito), U.S. Pat. No. 6,413,645 (Graff et al.), U.S. Pat. No. 6,522,067 (Graff et al.), and U.S. Patent Application Publication No. 2006/0246811 (Winters et al.), the latter reference hereby incorporated by reference in its entirety.

Such encapsulating layers may be deposited by various techniques, including atomic layer deposition (ALD). One such atomic layer deposition apparatus is further described in WO 01/82390 (Ghosh et al.) describes the use of first and second thin-film encapsulation layers made of different materials wherein one of the thin-film layers is deposited at 50 nm using atomic layer deposition discussed below. According to this disclosure, a separate protective layer is also employed, e.g., parylene. Such thin multi-layer coatings typically attempt to provide a moisture permeation rate of less than $5 \times 10^{-6}$ g/m$^2$/day to adequately protect the OLED materials. In contrast, typically polymeric materials have a moisture permeation rate of approximately 0.1 gm/m$^2$/day and cannot adequately protect the OLED materials without additional moisture blocking layers. With the addition of inorganic moisture blocking layers, 0.01 g/m$^2$/day may be achieved and it has been reported that the use of relatively thick polymer smoothing layers with inorganic layers may provide the needed protection. Thick inorganic layers, for example 5 microns or more of ITO or ZnSe, applied by conventional deposition techniques such as sputtering or vacuum evaporation may also provide adequate protection, but thinner conventionally coated layers may only provide protection of 0.01 gm/m$^2$/day. U.S. Patent Application Publication No. 2007/0099356 (Park et al.) similarly describes a method for thin film encapsulation of flat panel displays using atomic layer deposition.

WO 04/105149 (Carcia et al.) describes gas permeation barriers that can be deposited on plastic or glass substrates by atomic layer deposition. Atomic layer deposition is also known as atomic layer epitaxy (ALE) or atomic layer CVD (ALCVD), and reference to ALD herein is intended to refer to all such equivalent processes. The use of the ALD coatings can reduce permeation by many orders of magnitude at thicknesses of tens of nanometers with low concentrations of coating defects. These thin coatings preserve the flexibility and transparency of the plastic substrate. Such articles are useful in container, electrical, and electronic applications. However, such protective layers also cause additional problems with light trapping in the layers since they may be of lower index than the light-emitting organic layers.

Although the requirement for the barrier layer of an OLED display has not been elucidated completely, Park et al. (Park et al., Ultrathin Film Encapsulation of an OLED by ALD, Electrochemical and Solid-State Letters, 8 (2), H21-H23, 2005) mention that the barrier properties of water transmission rate less than $10^{-6}$ g/m$^2$/day and oxygen transmission rate less than $10^{-5}$ cc/m$^2$/day may be considered as sufficient.

In general, it has been found that multilayer combinations of specifically inorganic dielectrics layers and polymer layers can be more than three orders of magnitude less permeable to water and oxygen than an inorganic single layer, presumably due the increased lag time of permeation (G. L. Graff et al., Mechanisms of Vapor Permeation through Multilayer Barrier Films: Lag Time Versus Equilibrium Permeation, J. Appl. Physics, Vol. 96, No. 4, 2004, pp. 1840-1849). Barriers with alternating inorganic/organic layers with as many as 12 individual layers reportedly approach the performance needed by OLEDs (M. S. Weaver et al., Applied Physics Letter 81, 2929, 2002). As a result, many existing thin film encapsulation technologies focus of creating multilayers of thin film, mostly, organic/inorganic combinations, though purely inorganic or organic encapsulations are also known. Where the inorganic material is involved, the deposition of a high barrier inorganic layer is considered to be the most important technology in the entire encapsulation process, since the permeation through the encapsulation layer is mostly controlled by the defects in inorganic film.

While multiple layers provide better protection for OLED displays, thicker layers diminish transparency and as a result brightness and color saturation of the display.

Therefore, there exists a need for developing processes and methods for thin film deposition of encapsulation and barrier layers with advantageous optical properties.

Among the techniques widely used for thin-film deposition is chemical vapor deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductors, integrated circuits, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition (ALD) is an alternative film deposition technology that can provide improved thickness resolution and conformal capabilities, compared to its CVD predecessor. The ALD process segments the conventional thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In practice, in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous metal precursor molecule effectively reacts with all of the ligands on the substrate surface, resulting in deposition of a single atomic layer of the metal:

$$\text{substrate-}AH + ML_x \rightarrow \text{substrate-}AML_{x-1} + HL \quad (1)$$

where HL is a reaction by-product. During the reaction, the initial surface ligands, AH, are consumed, and the surface becomes covered with L ligands, which cannot further react with metal precursor $ML_d$. Therefore, the reaction self-terminates when all of the initial AH ligands on the surface are replaced with $AML_{x-1}$ species. The reaction stage is typically followed by an inert-gas purge stage that eliminates the excess metal precursor from the chamber prior to the separate introduction of a second reactant gaseous precursor material.

The second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

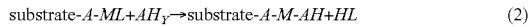

$$\text{substrate-}A\text{-}ML + AH_Y \rightarrow \text{substrate-}A\text{-}M\text{-}AH + HL \quad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, the basic ALD process requires alternating, in sequence, the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all alike in chemical kinetics, deposition per cycle, composition, and thickness.

ALD can be used as a fabrication step for forming a number of types of thin-film electronic devices, including semiconductor devices and supporting electronic components such as resistors and capacitors, insulators, bus lines and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent materials such as indium-tin oxide (ITO), doped zinc oxide ZnO, $SnO_2$, or $In_2O_3$. The thickness of the conductor may vary, and according to particular examples it can range from about 50 to about 1000 nm.

Examples of useful semiconducting materials are compound semiconductors such as gallium arsenide, gallium nitride, cadmium sulfide, intrinsic zinc oxide, and zinc sulfide.

A dielectric material electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as dielectrics. Of these materials, aluminum oxides are preferred.

A dielectric structure layer may comprise two or more layers having different dielectric constants. Such insulators are discussed in U.S. Pat. No. 5,981,970 (Dimitrakopoulos et al.) hereby incorporated by reference and copending U.S. Patent Publication No. 2006/0214154 (Yang et al.), hereby incorporated by reference. Dielectric materials typically exhibit a band-gap of greater than about 5 eV. The thickness of a useful dielectric layer may vary, and according to particular examples it can range from about 10 to about 300 nm.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the necessary interfaces are created.

In typical applications of a thin film transistor, the need is for a switch that can control the flow of current through the device. As such, it is desired that when the switch is turned on, a high current can flow through the device. The extent of current flow is related to the semiconductor charge carrier mobility. When the device is turned off, it is desirable that the current flow be very small. This is related to the charge carrier concentration. Furthermore, it is generally preferable that visible light have little or no influence on thin-film transistor response. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, for high-volume manufacture onto a moving web, it is highly desirable that chemistries used in the process be both inexpensive and of low toxicity, which can be satisfied by the use of ZnO and the majority of its precursors.

Self-saturating surface reactions make ALD relatively insensitive to transport non-uniformities, which might otherwise impair surface uniformity, due to engineering tolerances and the limitations of the flow system or related to surface topography (that is, deposition into three dimensional, high aspect ratio structures). As a general rule, a non-uniform flux of chemicals in a reactive process generally results in different completion times over different portions of the surface area. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with one cycle having numbered steps 1 through 4 as listed earlier). A useful and economically feasible cycle time must be achieved in order to provide a uniform film thickness in a range of about from 3 nm to 30 nm for many or most semiconductor applications, and even thicker films for other applications. According to industry throughput standards, substrates are preferably processed within 2 minutes to 3 minutes, which means that ALD cycle times must be in a range from about 0.6 seconds to about 6 seconds.

ALD offers considerable promise for providing a controlled level of highly uniform thin film deposition. However, in spite of its inherent technical capabilities and advantages, a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly cycle the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this rapid sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, that is:

$$\tau = VP/Q \qquad (3)$$

In a typical ALD chamber the volume (V) and pressure (P) are dictated independently by the mechanical and pumping constraints, leading to difficulty in precisely controlling the residence time to low values. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times with improved chemical utilization efficiency, and, on the other hand, the need to minimize purge-gas residence and chemical removal times. One approach to overcome the inherent limitations of "pulsed" delivery of gaseous material is to provide each reactant gas continuously and to move the substrate through each gas in succession. For example, U.S. Pat. No. 6,821,563 (Yudovsky) describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 (Suntola et al.). A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by having a carrier gas opening between exhaust openings. Suntola et al. '022 state that operation with such an embodiment is possible even at atmospheric pressure, although little or no details of the process, or examples, are provided.

While systems such as those described in the '563 Yudovsky and '022 Suntola et al. disclosures may avoid some of the difficulties inherent to pulsed gas approaches, these systems have other drawbacks. Neither the gas flow delivery unit of the '563 Yudovsky disclosure nor the gas flow array of the '022 Suntola et al. disclosure can be used in closer proximity to the substrate than about 0.5 mm. Neither of the gas flow delivery apparatus disclosed in the '563 Yudovsky and '022 Suntola et al. patents are arranged for possible use with a moving web surface, such as could be used as a flexible substrate for forming electronic circuits, light sensors, or displays, for example. The complex arrangements of both the gas flow delivery unit of the '563 Yudovsky disclosure and the gas flow array of the '022 Suntola et al. disclosure, each providing both gas flow and vacuum, make these solutions difficult to implement and costly to scale and limit their potential usability to deposition applications onto a moving substrate of limited dimensions. Moreover, it would be very difficult to maintain a uniform vacuum at different points in an array and to maintain synchronous gas flow and vacuum at complementary pressures, thus compromising the uniformity of gas flux that is provided to the substrate surface.

U.S. Patent Application Publication No. 2005/0084610 (Selitser) discloses an atmospheric pressure atomic layer chemical vapor deposition process. U.S. Patent Application Publication No. 2005/0084610 states that extraordinary increases in reaction rates are obtained by changing the operating pressure to atmospheric pressure, which will involve orders of magnitude increase in the concentration of reactants, with consequent enhancement of surface reactant rates. The embodiments of U.S. Patent Application Publication No. 2005/0084610 involve separate chambers for each stage of the process, although FIG. 10 in U.S. Patent Application Publication No. 2005/0084610 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes thereunder in the process. Little or no specific details of the gas injectors or manifolds are described by U.S. Patent Application Publication No. 2005/0084610, although they state that spacing of the injectors is selected so that cross-contamination from adjacent injectors is prevented by purging gas flows and exhaust manifolds incorporate in each injector.

In view of the above, it can be seen that there is a need for developing processes and methods for thin film material deposition including ALD deposition method and apparatus that can provide improved characteristics to allow for more precise control over density, thickness, composition of the thin film material layers, and therefore their bather and optical properties.

SUMMARY OF THE INVENTION

Briefly, according to one aspect of the present invention a process of making an optical film or optical array comprises:

a) simultaneously directing a series of gas flows along elongated substantially parallel channels to form a first thin film on a substrate; wherein the series of gas flows comprises, in order, at least a first reactive gaseous material, an inert purge gas, and a second reactive gaseous material; wherein the first reactive gaseous material is capable of reacting with a substrate surface treated with the second reactive gaseous material to form the first thin film; b) repeating step a) a plurality of times to produce a first thickness of a first film layer with a first optical property; wherein the process is carried out at or above atmospheric pressure; c) repeating steps a) and b) to produce a second film layer; and wherein the process is carried out substantially at or above atmospheric pressure.

According to another aspect of the present invention, a process of making a thin film electronic device includes providing an electronic device on a substrate. A plurality of gaseous material sources including a first source of a first reactant gaseous material, a second source of a second reactant gaseous material, and a third source of a inert gaseous material are provided. A delivery head is provided in fluid communication with the gaseous material sources through a plurality of inlet ports. The first gaseous material source is connected to a first inlet port. The second gaseous material source is connected to a second inlet port. The third gaseous material source is connected to a third inlet port. The delivery head includes an output face and a first plurality of elongated substantially parallel emissive channels connected in fluid communication with the first inlet port. A second plurality of elongated substantially parallel emissive channels is connected to the second inlet port. A third plurality of elongated substantially parallel emissive channels is connected to the third inlet port. At least one of the third elongated emissive channels is positioned to separate at least one of the first elongated emissive channels and at least one of the second elongated emissive channels. One or more of the first reactant gaseous material, the second reactant gaseous material, and the inert gaseous material is caused to flow through the first elongated emissive channel, the second elongated emissive channel, and the third elongated emissive channel, respectively, of the delivery head. The flow includes a pressure. The pressure generated by the flow of the one or more of the first reactant gaseous material, the second reactant gaseous material, and the third inert gaseous materials creates a gas fluid bearing that maintains a substantially uniform distance between the output face of the delivery head and the substrate. The first reactant gaseous material, the second reactant gaseous material, and the inert gaseous material are simultaneously directed to flow through the first elongated emissive channel, the second elongated emissive channel, and the third elongated emissive channel, respectively, of the delivery head toward the electronic device and the substrate. A relative motion caused between the delivery head and the substrate causes the second reactant gaseous material to react with at least a portion of the electronic device and a portion of the substrate that has been treated with the first reactant gaseous material to create a thin film over at least one of the portion of the electronic device and the portion of the substrate that has been treated with the first reactant gaseous material.

The invention and its objects and advantages will become more apparent in the detailed description of the preferred embodiment presented below.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 3A and 3B are cross-sectional side views of one embodiment of a delivery device, schematically showing the accompanying deposition operation;

FIG. 5D is a plan view of a base plate for the delivery device of FIG. 4;

FIG. 8D is a perspective view of gas mixing within the gas diffuser unit of FIG. 7;

FIG. 8E is a perspective view of the gas ventilation path using the gas diffuser unit of FIG. 7;

FIG. 9A is a perspective view of a portion of the delivery device in an embodiment using vertically stacked plates;

FIG. 14 is a side view of one embodiment of a deposition system comprising a floating delivery device and showing relevant distance dimensions and force directions;

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

For the description that follows, superposition has its conventional meaning, wherein elements are laid atop or against one another in such manner that parts of one element align with corresponding parts of another and that their perimeters generally coincide.

Terms "upstream" and "downstream" have their conventional meanings as relates to the direction of gas flow.

The apparatus of the present invention offers a significant departure from conventional approaches to ALD, employing an improved distribution device for delivery of gaseous materials to a substrate surface, adaptable to deposition on larger and web-based substrates and capable of achieving a highly uniform thin-film deposition at improved throughput speeds. The apparatus and method of the present invention employs a continuous (as opposed to pulsed) gaseous material distribution. The apparatus of the present invention allows operation at atmospheric or near-atmospheric pressures as well as under vacuum and is capable of operating in an unsealed or open-air environment.

Figure 1:
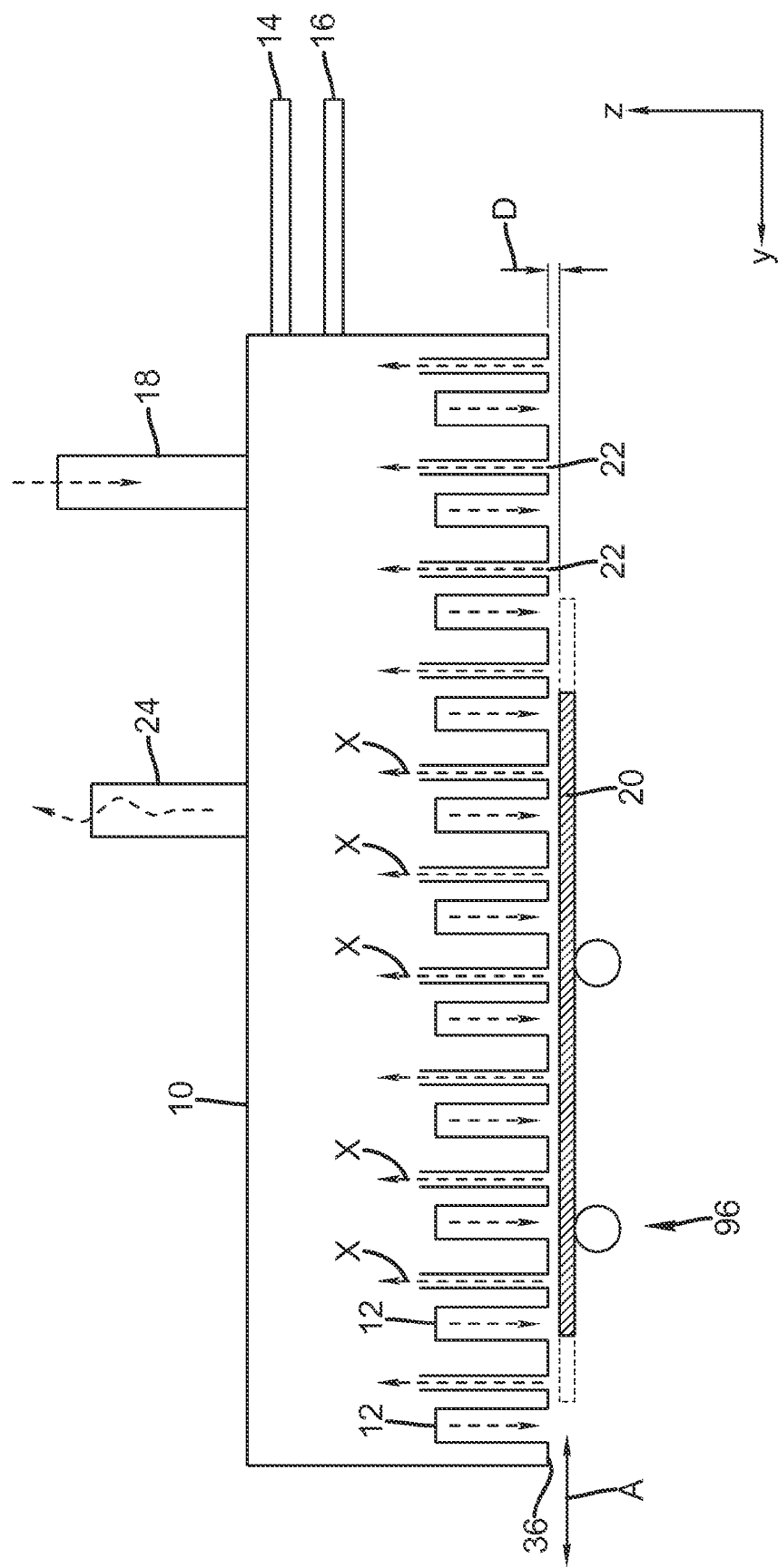
FIG. 1 is a cross-sectional side view of one embodiment of a delivery device for atomic layer deposition according to the present invention.

Referring to FIG. 1, there is shown a cross-sectional side view of one embodiment of a delivery head 10 for atomic layer deposition onto a substrate 20 according to the present invention. Delivery head 10 has a gas inlet port connected to conduit 14 for accepting a first gaseous material, a gas inlet port connected to conduit 16 for accepting a second gaseous material, and a gas inlet port connected to conduit 18 for accepting a third gaseous material. These gases are emitted at an output face 36 via output channels 12, having a structural arrangement described subsequently. The dashed line arrows in FIG. 1 and subsequent FIGS. 2-3B refer to the delivery of gases to substrate 20 from delivery head 10. In FIG. 1, dotted line arrows X also indicate paths for gas exhaust (shown directed upwards in this figure) and exhaust channels 22, in communication with an exhaust port connected to conduit 24. For simplicity of description, gas exhaust is not indicated in FIGS. 2-3B. Because the exhaust gases still may contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 1, substrate 20 is moved by a substrate support 96 across output face 36 in reciprocating fashion, as indicated by the arrow A and by phantom outlines to the right and left of substrate 20 in FIG. 1. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

Figure 2:
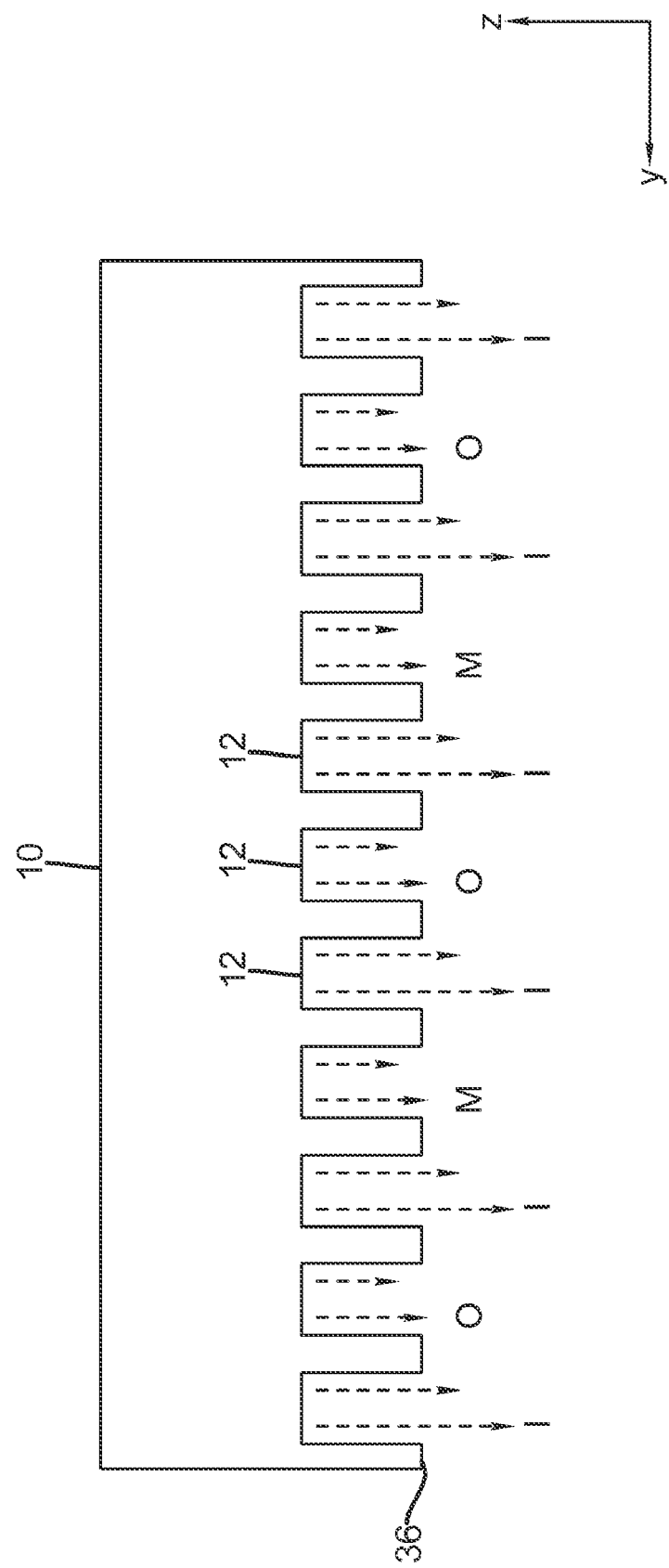
FIG. 2 is a cross-sectional side view of one embodiment of a delivery device showing one exemplary arrangement of gaseous materials provided to a substrate that is subject to thin film deposition.

The cross-sectional view of FIG. 2 shows gas flows emitted over a portion of output face 36 of delivery head 10 (with the exhaust path omitted as noted earlier). In this particular arrangement, each output channel 12 is in gaseous flow communication with one of gas inlet conduits 14, 16 or 18 seen in FIG. 1. Each output channel 12 delivers typically a first reactant gaseous material O, or a second reactant gaseous material M, or a third inert gaseous material I.

FIG. 2 shows a relatively basic or simple arrangement of gases. It is envisioned that a plurality of flows of a non-metal deposition precursor (like material O) or a plurality of flows of a metal-containing precursor material (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. Significantly, an inter-stream labeled I for an inert gas, also termed a purge gas, separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 2 and following suggests some typical types of reactant gases. For example, first reactant gaseous material O could be an oxidizing gaseous material; second reactant gaseous material M would be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

Figure 3B:
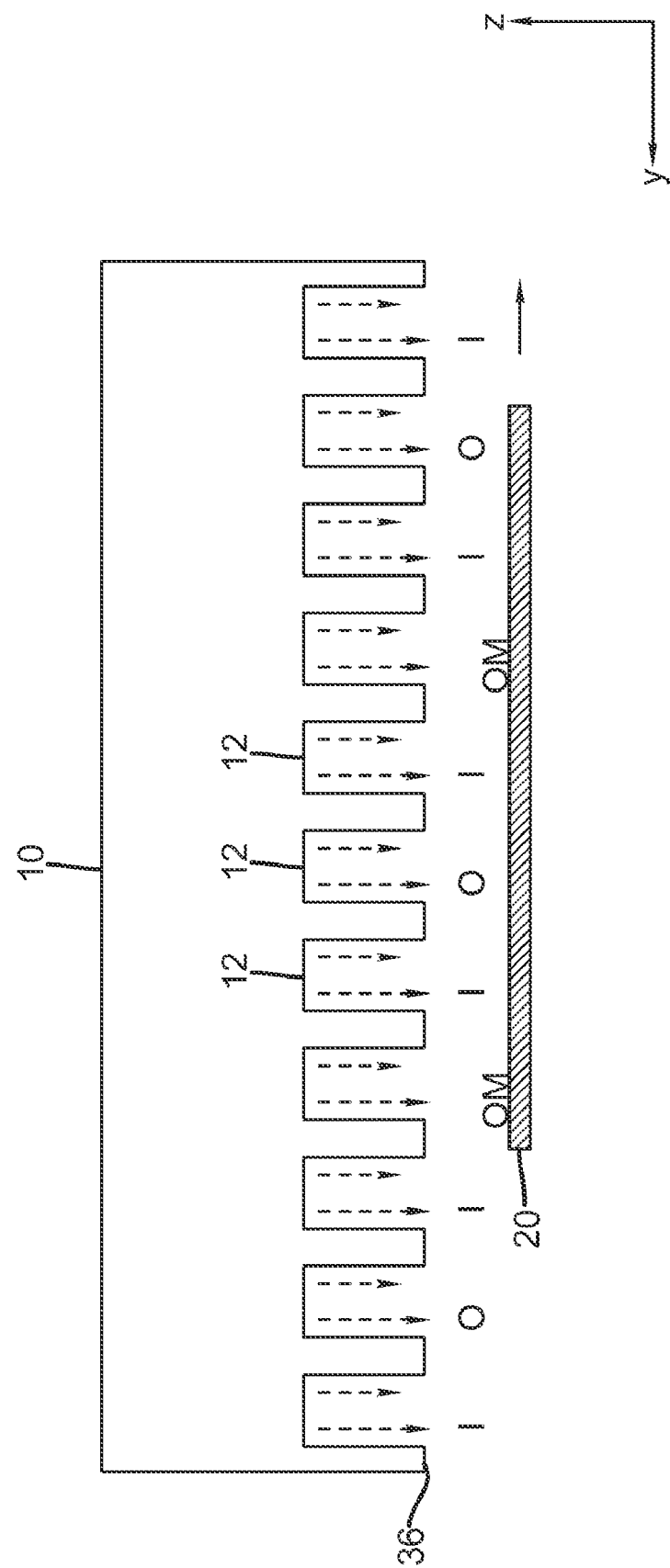

The cross-sectional views of FIGS. 3A and 3B show, in simplified schematic form, the ALD coating operation performed as substrate 20 passes along output face 36 of delivery head 10 when delivering reactant gaseous materials O and M. In FIG. 3A, the surface of substrate 20 first receives an oxidizing material continuously emitted from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials. Unlike conventional solutions, the deposition sequence shown in FIGS. 3A and 3B is continuous during deposition for a given substrate or specified area thereof, rather than pulsed. That is, materials O and M are continuously emitted as substrate 20 passes across the surface of delivery head 10 or, conversely, as delivery head 10 passes along the surface of substrate 20.

As FIGS. 3A and 3B show, inert gaseous material I is provided in alternate output channels 12, between the flows of first and second reactant gaseous materials O and M. Notably, as was shown in FIG. 1, there are exhaust channels 22, but preferably no vacuum channels interspersed between the output channels 12. Only exhaust channels 22, providing a small amount of draw, are needed to vent spent gases emitted from delivery head 10 and used in processing.

In one embodiment, as described in more detail in copending, commonly-assigned copending U.S. patent application Ser. No. 11/620,744, hereby incorporated by reference in its entirety, gas pressure is provided against substrate 20, such that separation distance D is maintained, at least in part, by the force of pressure that is exerted. By maintaining some amount of gas pressure between output face 36 and the surface of substrate 20, the apparatus of the present invention can provide at least some portion of an air bearing, or more properly a gas fluid bearing, for delivery head 10 itself or, alternately, for substrate 20. This arrangement helps to simplify the transport requirements for delivery head 10, as described subsequently. The effect of allowing the delivery device to approach the substrate such that it is supported by gas pressure, helps to provide isolation between the gas streams. By allowing the head to float on these streams, pressure fields are set up in the reactive and purge flow areas that cause the gases to be directed from inlet to exhaust with little or no intermixing of other gas streams. In one such embodiment, since the separation distance D is relatively small, even a small change in distance D (for example, even 100 micrometers) would require a significant change in flow rates and consequently gas pressure providing the separation distance D. For example, in one embodiment, doubling the separation distance D, involving a change less than 1 mm, would necessitate more than doubling, preferably more than quadrupling, the flow rate of the gases providing the separation distance D.

The present invention does not require a floating head system, however, and the delivery device and the substrate can be in at a fixed distance D as in conventional systems. For example, the delivery device and the substrate can be mechanically fixed at separation distance from each other in which the head is not vertically mobile in relationship to the substrate in response to changes in flow rates and in which the substrate is on a vertically fixed substrate support.

In one embodiment of the invention, the delivery device has an output face for providing gaseous materials for thin-film material deposition onto a substrate and comprises:
  (a) a plurality of inlet ports comprising at least a first, a second, and a third inlet port capable of receiving a common supply for a first, a second and a third gaseous material, respectively;

(b) a first plurality of elongated emissive channels, a second plurality of elongated emissive channels and a third plurality of elongated emissive channels, each of the first, second, and third elongated emissive channels allowing gaseous fluid communication with one of corresponding first, second, and third inlet ports;

wherein each of the first, second, and third plurality of elongated emissive channels extend in a length direction and are substantially in parallel;

wherein each first elongated emissive channel is separated on each elongated side thereof from the nearest second elongated emissive channel by a third elongated emissive channel;

wherein each first elongated emissive channel and each second elongated emissive channel is situated between third elongated emissive channels;

wherein each of the elongated emissive channels in at least one plurality of the first, second and third plurality of elongated emissive channels is capable of directing a flow, respectively, of at least one of the first, second, and the third gaseous material substantially orthogonally with respect to the output face of the delivery device, which flow of gaseous material is capable of being provided, either directly or indirectly from each of the elongated emissive channels in the at least one plurality, substantially orthogonally to the surface of the substrate; and wherein the delivery device is formed as a plurality of apertured plates, disposed substantially in parallel with respect to the output face, and superposed to define a network of interconnecting supply chambers and directing channels for routing each of the first, second, and third gaseous materials from its corresponding inlet port to its corresponding plurality of elongated emissive channels.

Figure 4:
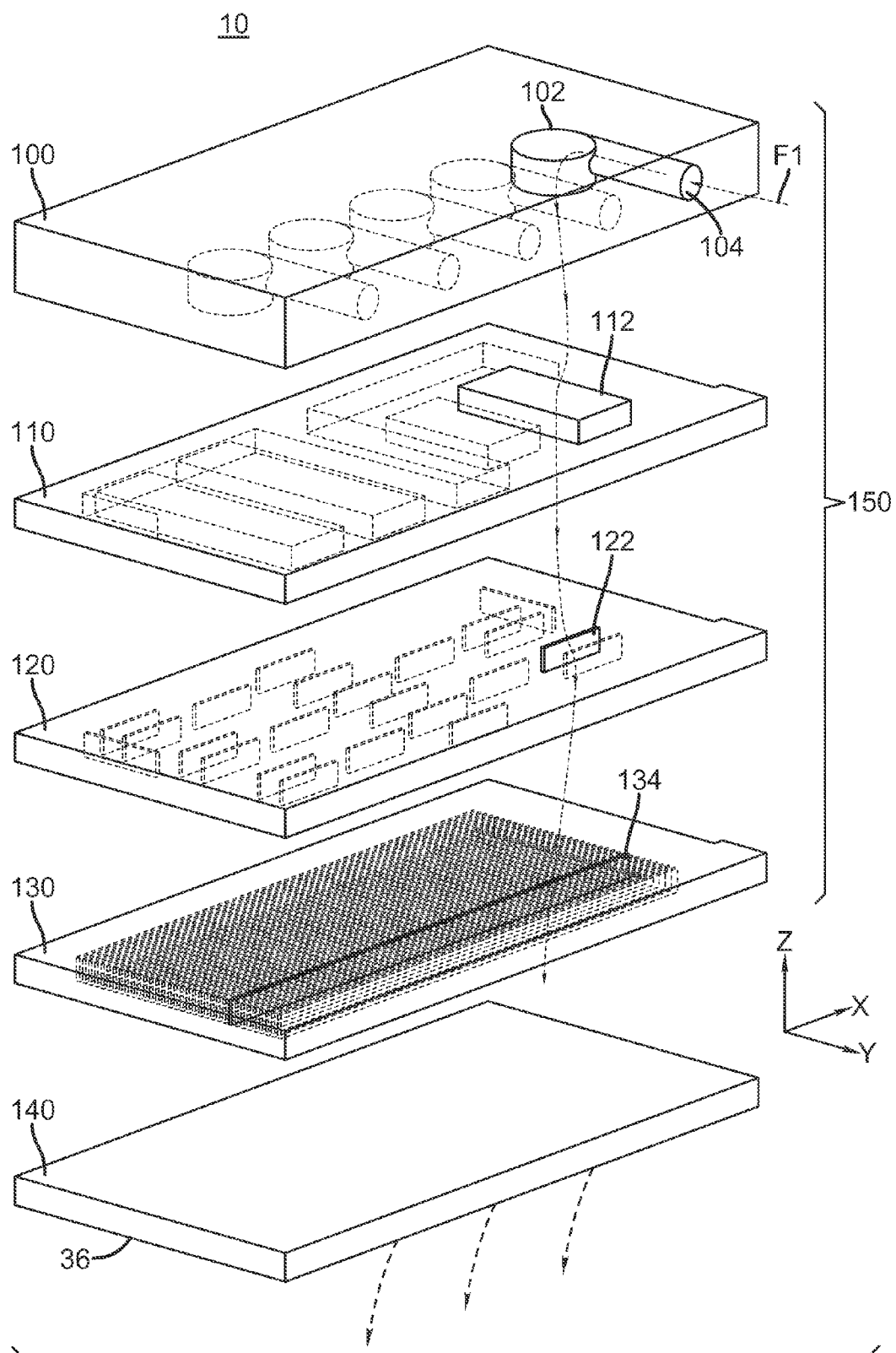
FIG. 4 is a perspective exploded view of a delivery device in a deposition system according to one embodiment, including an optional diffuser unit.

The exploded view of FIG. 4 shows, for a small portion of the overall assembly in one such embodiment, how delivery head 10 can be constructed from a set of apertured plates and shows an exemplary gas flow path for just one portion of one of the gases. A connection plate 100 for the delivery head 10 has a series of input ports 104 for connection to gas supplies that are upstream of delivery head 10 and not shown in FIG. 4. Each input port 104 is in communication with a directing chamber 102 that directs the received gas downstream to a gas chamber plate 110. Gas chamber plate 110 has a supply chamber 112 that is in gas flow communication with an individual directing channel 122 on a gas direction plate 120. From directing channel 122, the gas flow proceeds to a particular elongated exhaust channel 134 on a base plate 130. An optional gas diffuser unit 140 provides diffusion and final delivery of the input gas at its output face 36. An exemplary gas flow F1 is traced through each of the component assemblies of delivery head 10. The x-y-z axis orientation shown in FIG. 4 also applies for FIGS. 5A and 7 in the present application.

As shown in the example of FIG. 4, delivery assembly 150 of delivery head 10 is formed as an arrangement of superposed apertured plates: connection plate 100, gas chamber plate 110, gas direction plate 120, and base plate 130. These plates are disposed substantially in parallel to output face 36 in this "horizontal" embodiment. Gas diffuser unit 140 can also be formed from superposed apertured plates, as is described subsequently. It can be appreciated that any of the plates shown in FIG. 4 could itself be fabrication from a stack of superposed plates. For example, it may be advantageous to form connection plate 100 from four or five stacked apertured plates that are suitably coupled together. This type of arrangement can be less complex than machining or molding methods for forming directing chambers 102 and input ports 104.

Although gas diffuser unit 140 can be used to equalize the flow through the output channel providing the gaseous materials to the substrate, the output channel can be used to provide the gaseous materials without a diffuser, as in U.S. Pat. No. 4,413,022 (Suntola et al.), hereby incorporated by reference. By providing undiffused flows, higher throughputs may be obtained, possibly at the expense of less homogenous deposition. On the other hand, a diffuser system is especially advantageous for a floating head system described above, since it can provide a back pressure within the delivery device that facilitates the floating of the head.

Figure 5A:
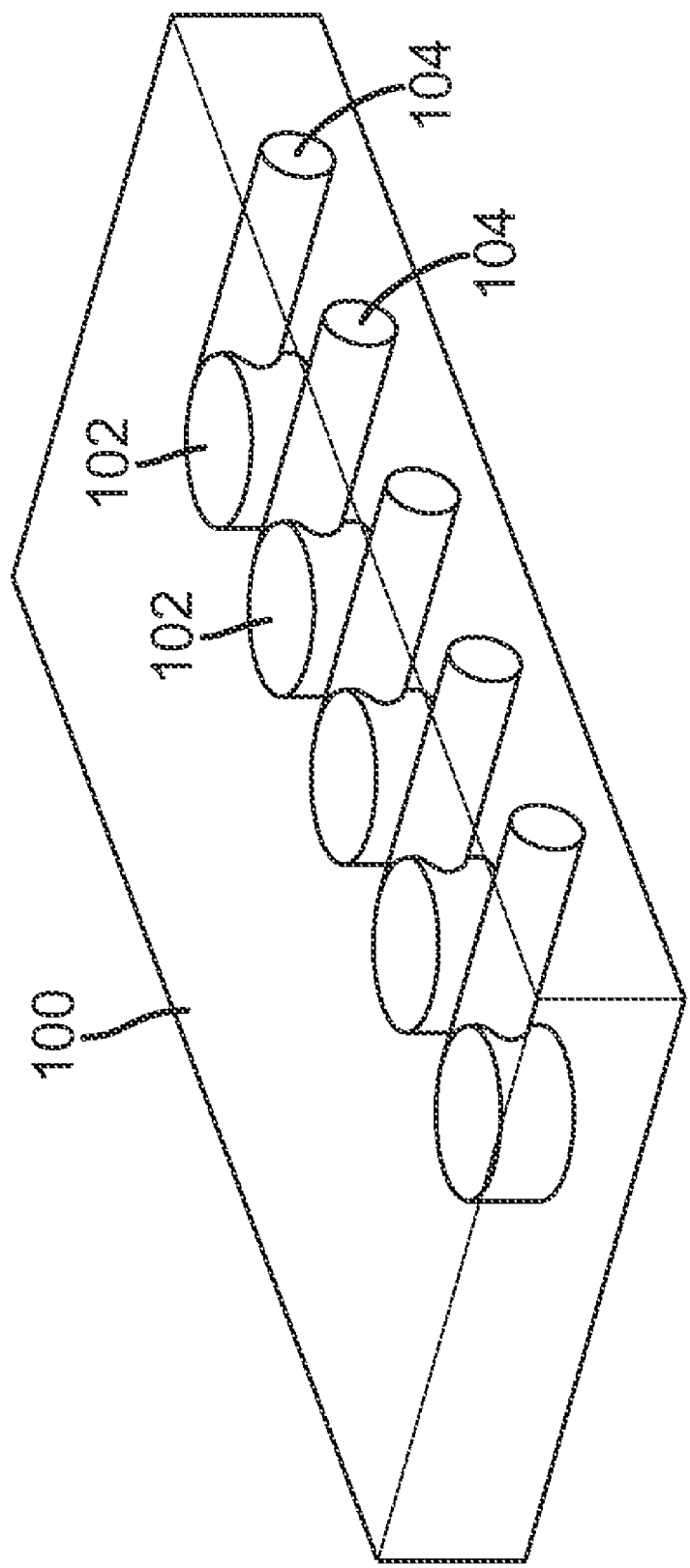
FIG. 5A is a perspective view of a connection plate for the delivery device of FIG. 4.
Figure 5B:
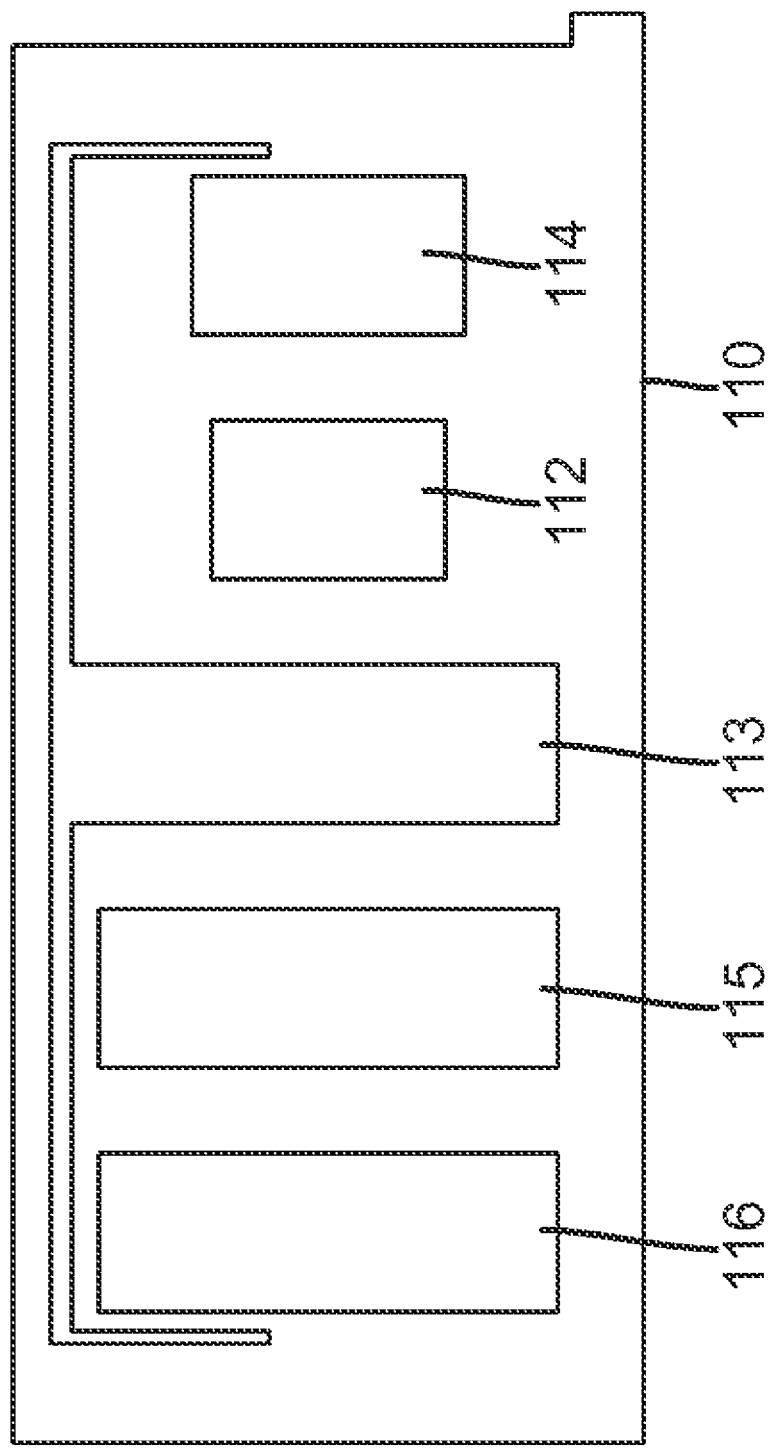
FIG. 5B is a plan view of a gas chamber plate for the delivery device of FIG. 4.

FIGS. 5A through 5D show each of the major components that are combined together to form delivery head 10 in the embodiment of FIG. 4. FIG. 5A is a perspective view of connection plate 100, showing multiple directing chambers 102. FIG. 5B is a plan view of gas chamber plate 110. A supply chamber 113 is used for purge or inert gas (involving mixing on a molecular basis between the same molecular species during steady state operation) for delivery head 10 in one embodiment. A supply chamber 115 provides mixing for a precursor gas (O) in one embodiment; an exhaust chamber 116 provides an exhaust path for this reactive gas. Similarly, a supply chamber 112 provides the other needed reactive gas, second reactant gaseous material (M); an exhaust chamber 114 provides an exhaust path for this gas.

Figure 5C:
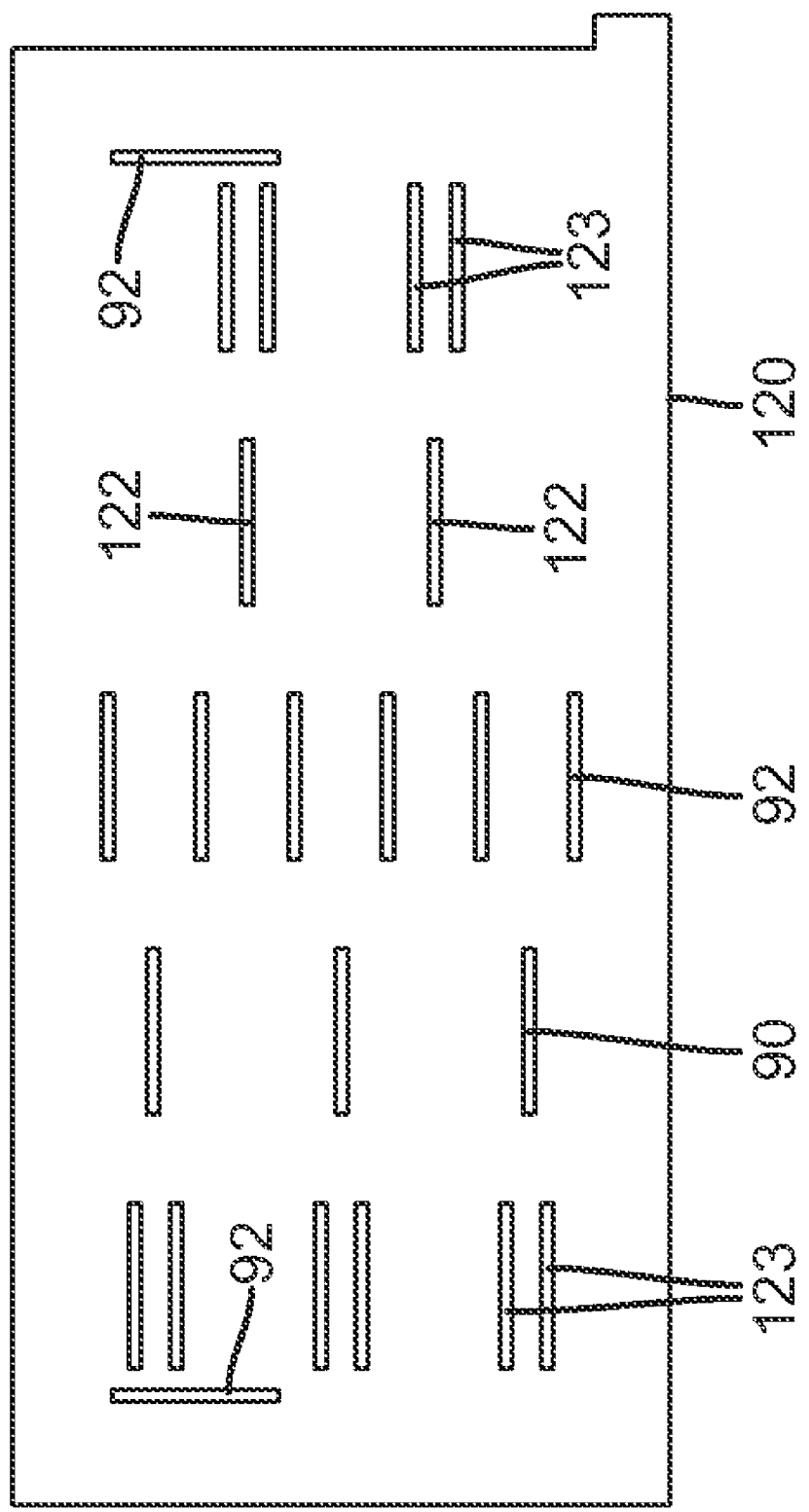
FIG. 5C is a plan view of a gas direction plate for the delivery device of FIG. 4.

FIG. 5C is a plan view of gas direction plate 120 for delivery head 10 in this embodiment. Multiple directing channels 122, providing a second reactant gaseous material (M), are arranged in a pattern for connecting the appropriate supply chamber 112 (not shown in this view) with base plate 130. Corresponding exhaust directing channels 123 are positioned near directing channels 122. Directing channels 90 provide the first reactant gaseous material (O). Directing channels 92 provide purge gas (I). Again, it must be emphasized that FIGS. 4 and 5A-5D show one illustrative embodiment; numerous other embodiments are also possible.

FIG. 5D is a plan view of base plate 130 for delivery head 10. Base plate 130 has multiple elongated emissive channels 132 interleaved with elongated exhaust channels 134.

Figure 6:
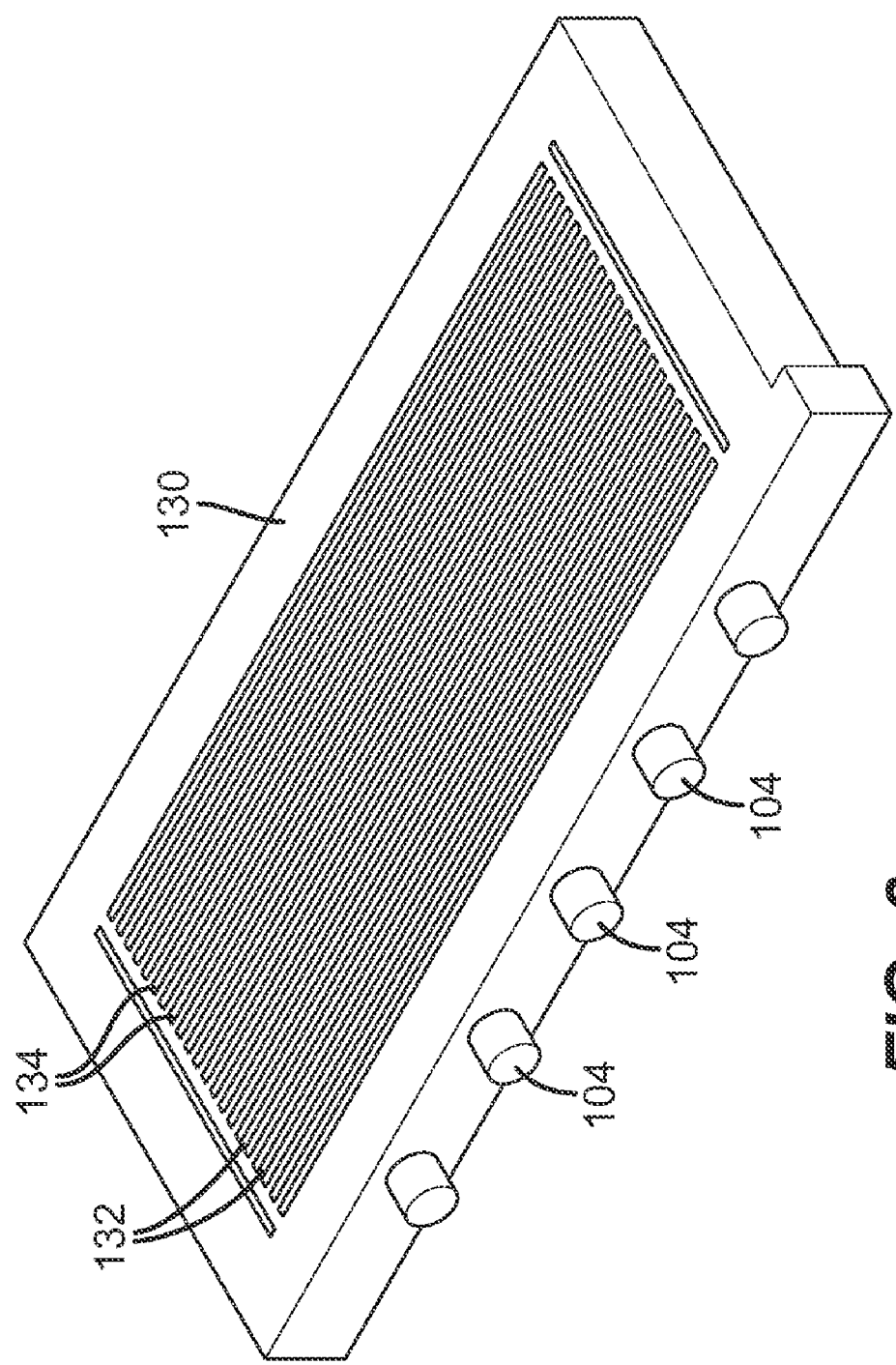
FIG. 6 is a perspective view showing a base plate on a delivery device in one embodiment.

FIG. 6 is a perspective view showing base plate 130 formed from horizontal plates and showing input ports 104. The perspective view of FIG. 6 shows the external surface of base plate 130 as viewed from the output side and having elongated emissive channels 132 and elongated exhaust channels 134. With reference to FIG. 4, the view of FIG. 6 is taken from the side that faces the direction of the substrate.

Figure 7:
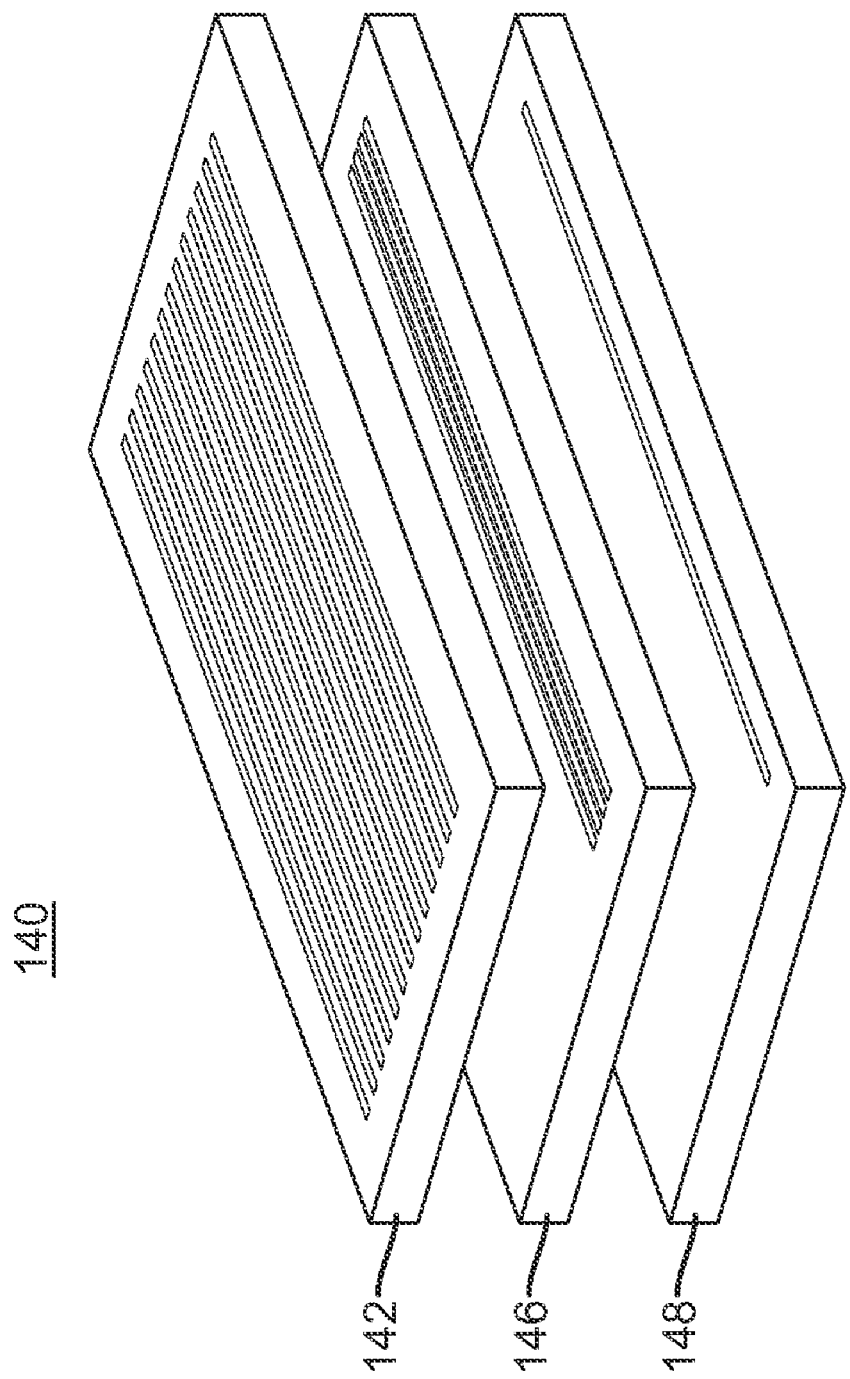
FIG. 7 is an exploded view of a gas diffuser unit according to one embodiment.
Figure 8A:
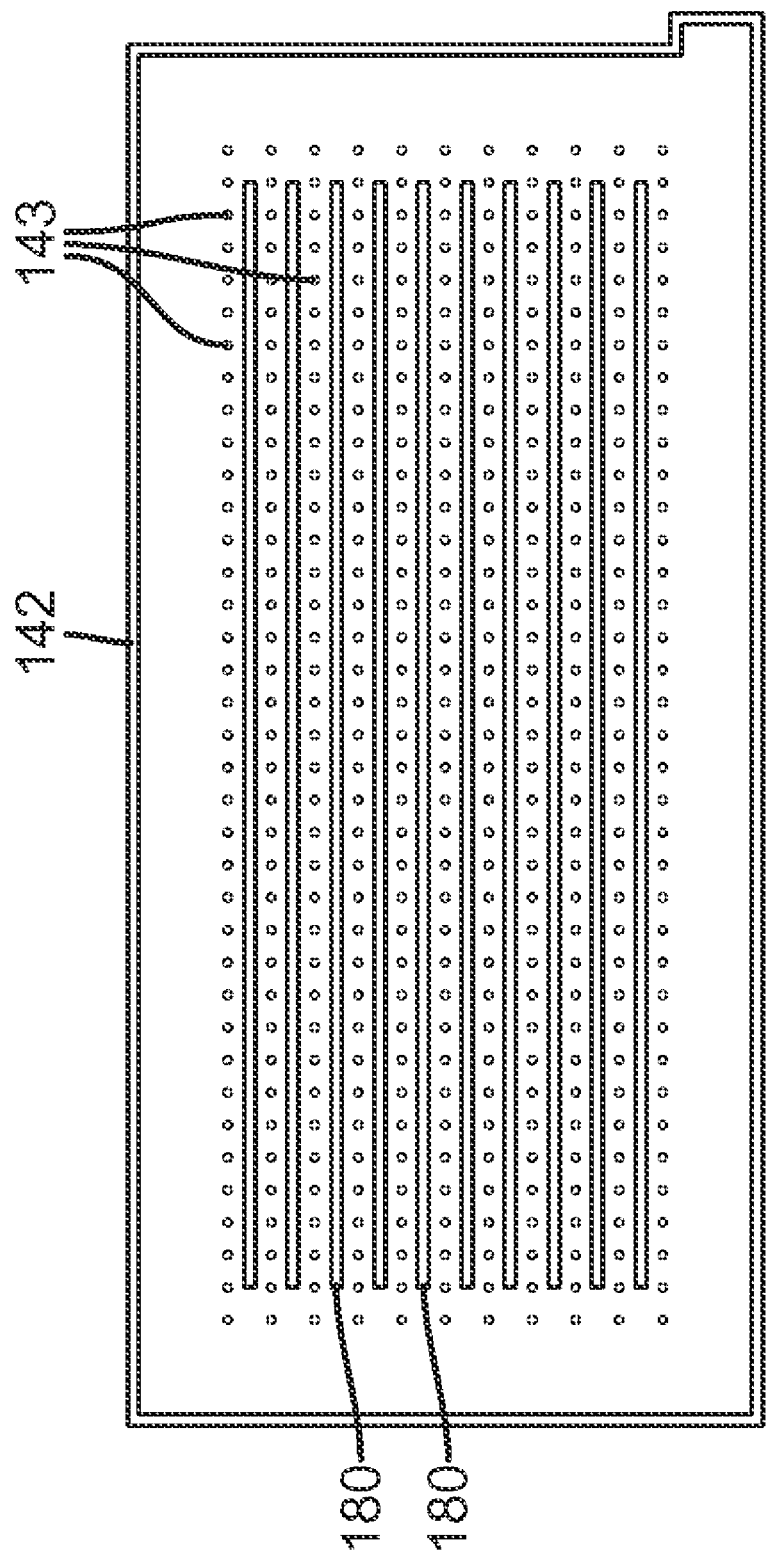
FIG. 8A is a plan view of a nozzle plate of the gas diffuser unit of FIG. 7.

The exploded view of FIG. 7 shows the basic arrangement of components used to form one embodiment of an optional gas diffuser unit 140, as used in the embodiment of FIG. 4 and in other embodiments as described subsequently. These include a nozzle plate 142, shown in the plan view of FIG. 8A. As shown in the views of FIGS. 6, 7, and 8A, nozzle plate 142 mounts against base plate 130 and obtains its gas flows from elongated emissive channels 132. In the embodiment shown, first diffuser output passages 143 in the form of nozzle holes provide the needed gaseous materials. Slots 180 are provided in the exhaust path, as described subsequently.

Figure 8B:
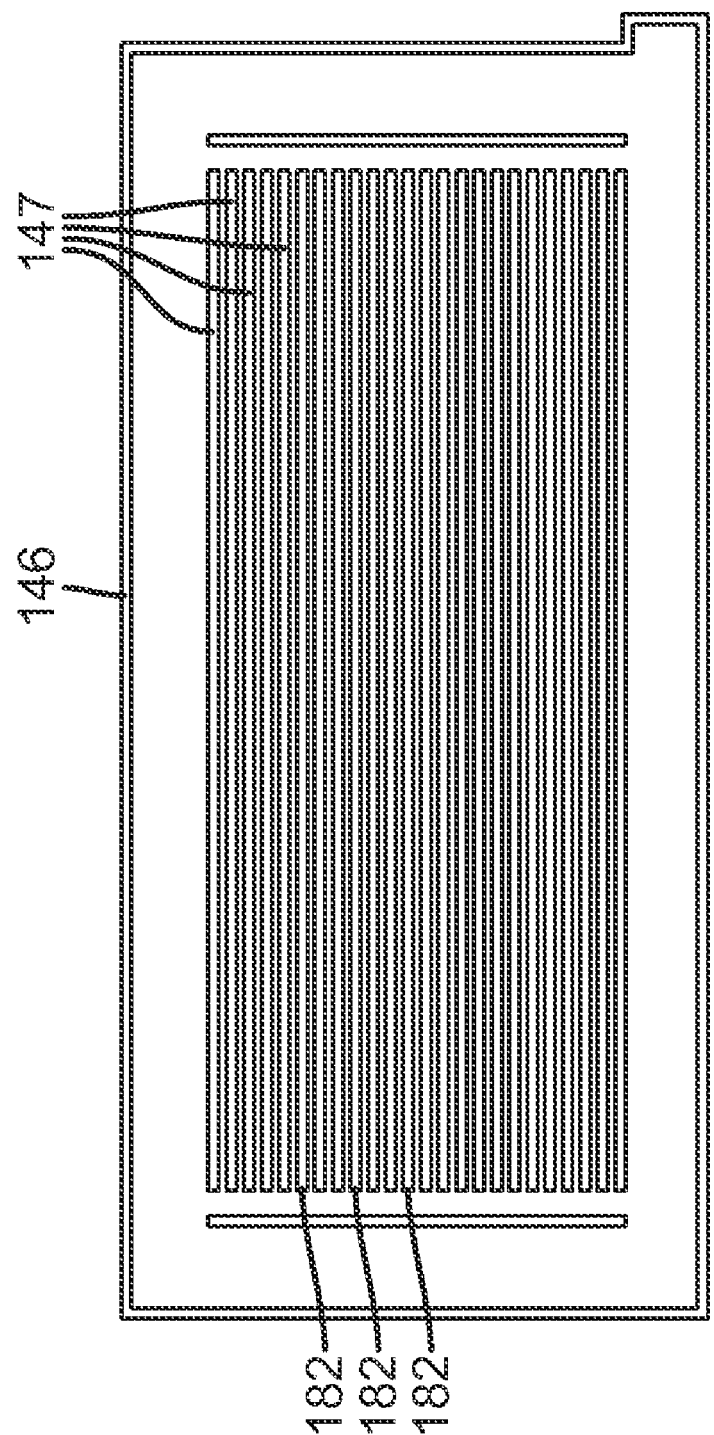
FIG. 8B is a plan view of a gas diffuser plate of the gas diffuser unit of FIG. 7.

A gas diffuser plate 146, which diffuses in cooperation with nozzle plate 142 and face plate 148, shown in FIG. 8B, is mounted against nozzle plate 142. The arrangement of the various passages on nozzle plate 142, gas diffuser plate 146, and face plate 148 are optimized to provide the needed amount of diffusion for the gas flow and, at the same time, to efficiently direct exhaust gases away from the surface area of substrate 20. Slots 182 provide exhaust ports. In the embodiment shown, gas supply slots forming second diffuser output passage 147 and exhaust slots 182 alternate in gas diffuser plate 146.

Figure 8C:
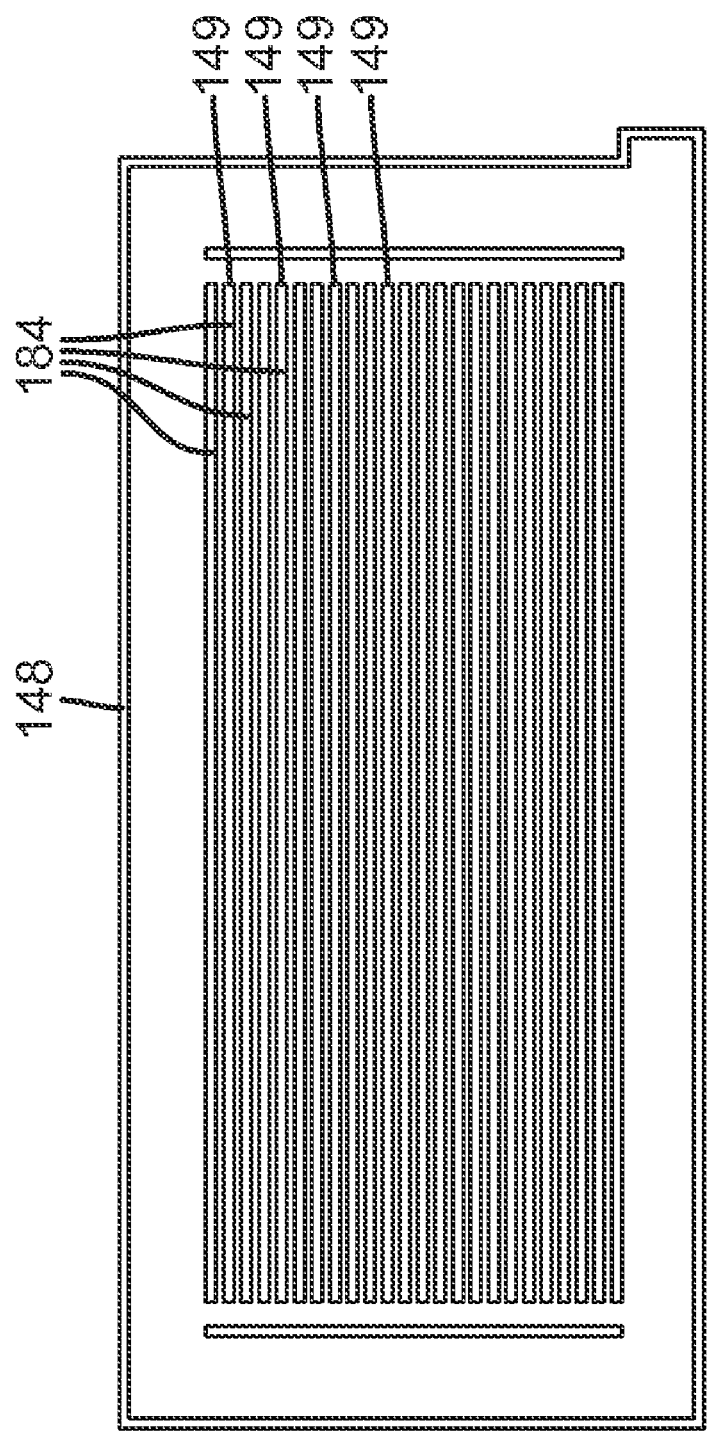
FIG. 8C is a plan view of a face plate of the gas diffuser unit of FIG. 7.

A face plate 148, as shown in FIG. 8C, then faces substrate 20. Third diffuser output passage 149 for providing gases and exhaust slots 184 again alternate with this embodiment.

FIG. 8D focuses on the gas delivery path through gas diffuser unit 140; FIG. 8E then shows the gas exhaust path in a corresponding manner. Referring to FIG. 8D there is shown, for a representative set of gas ports, the overall arrangement used for thorough diffusion of the reactant gas for an output flow F2 in one embodiment. The gas from base plate 130 (FIG. 4) is provided through first diffuser output passage 143 on nozzle plate 142. The gas goes downstream to second diffuser output passage 147 on gas diffuser plate 146. As shown in FIG. 8D, there can be a vertical offset (that is, using the horizontal plate arrangement shown in FIG. 7, vertical being normal with respect to the plane of the horizontal plates) between diffuser output passages 143 and 147 in one embodiment, helping to generate backpressure and thus facilitate a more uniform flow. The gas then goes further downstream to third diffuser output passage 149 on face plate 148 to provide output channel 12. The different diffuser passages 143, 147 and 149 may not only be spatially offset, but may also have different geometries to contribute to intermolecular mixing and homogenous diffusion of the gaseous materials when flowing through the delivery device.

In the absence of the optional diffuser unit, the elongated emissive channels 132 in the base plate can serve as the output channels 12 for delivery head 10 instead of the third diffuser output passages 149.

FIG. 8E symbolically traces the exhaust path provided for venting or exhausting gases in a similar embodiment, where the downstream direction is opposite that for supplying gases. A flow F3 indicates the path of vented gases through exhaust slots 184, 182, and 180, respectively. Unlike the more circuitous mixing path of flow F2 for gas supply, the venting arrangement shown in FIG. 8E is intended for the rapid movement of spent gases from the surface. Thus, flow F3 is relatively direct, venting gases away from the substrate surface.

Referring back to FIG. 4, the combination of components shown as connection plate 100, gas chamber plate 110, gas direction plate 120, and base plate 130 can be grouped to provide a delivery assembly 150. Alternate embodiments are possible for delivery assembly 150, including one formed from vertical, rather than horizontal, apertured plates using the coordinate arrangement of FIG. 4.

Another embodiment of a delivery device having an output face for providing gaseous materials for thin-film material deposition onto a substrate comprises:

A delivery device having an output face for providing gaseous materials for thin-film material deposition onto a substrate comprising:

(a) a plurality of inlet ports comprising at least a first, second, and third inlet port capable of receiving a common supply for a first, second, and third gaseous material, respectively; and (b) a first plurality of first elongated emissive channels, a second plurality of second elongated emissive channels and a third plurality of third elongated emissive channels, each of the first, second, and third elongated emissive channels capable of gaseous fluid communication with one of corresponding first, second, and third inlet ports;

wherein each of the first, second, and third elongated emissive channels extend in a length direction and are substantially in parallel;

wherein each first elongated emissive channel is separated on each elongated side thereof from the nearest second elongated emissive channel by a third elongated emissive channel;

wherein each first elongated emissive channel and each second elongated emissive channel is situated between third elongated emissive channels;

wherein each of the elongated emissive channels in at least one plurality of the first, second and third plurality of elongated emissive channels is capable of directing a flow, respectively, of at least one of the first, second, and the third gaseous material substantially orthogonally with respect to the output face of the delivery device, which flow of gaseous material is capable of being provided, either directly or indirectly from each of the elongated emissive channels in the at least one plurality, substantially orthogonally to the surface of the substrate;

wherein at least a portion of the delivery device is formed as a plurality of apertured plates, superposed to define a network of interconnecting supply chambers and directing channels for routing each of the first, second, and third gaseous materials from its corresponding inlet port to its corresponding elongated emissive channels, and wherein the apertured plates are substantially perpendicularly disposed with respect to the output face; and wherein for each of the first, second, and third plurality of elongated emissive channels, each individual elongated emissive channel comprises: (i) two separator plates that defines side walls along the length of the individual elongated emissive channel, one separator plate on each side of a central plate; (ii) a central plate that defines the width of the individual elongated emissive channel, which central plate is sandwiched between the two separator plates; and wherein the alignment of apertures of the two separator plates and central plate provides fluid communication with the supply of one of the first, second, or third gaseous materials and permits passage of only one of the first, second, or third gaseous materials into the individual elongated emissive channel.

Figure 9B:
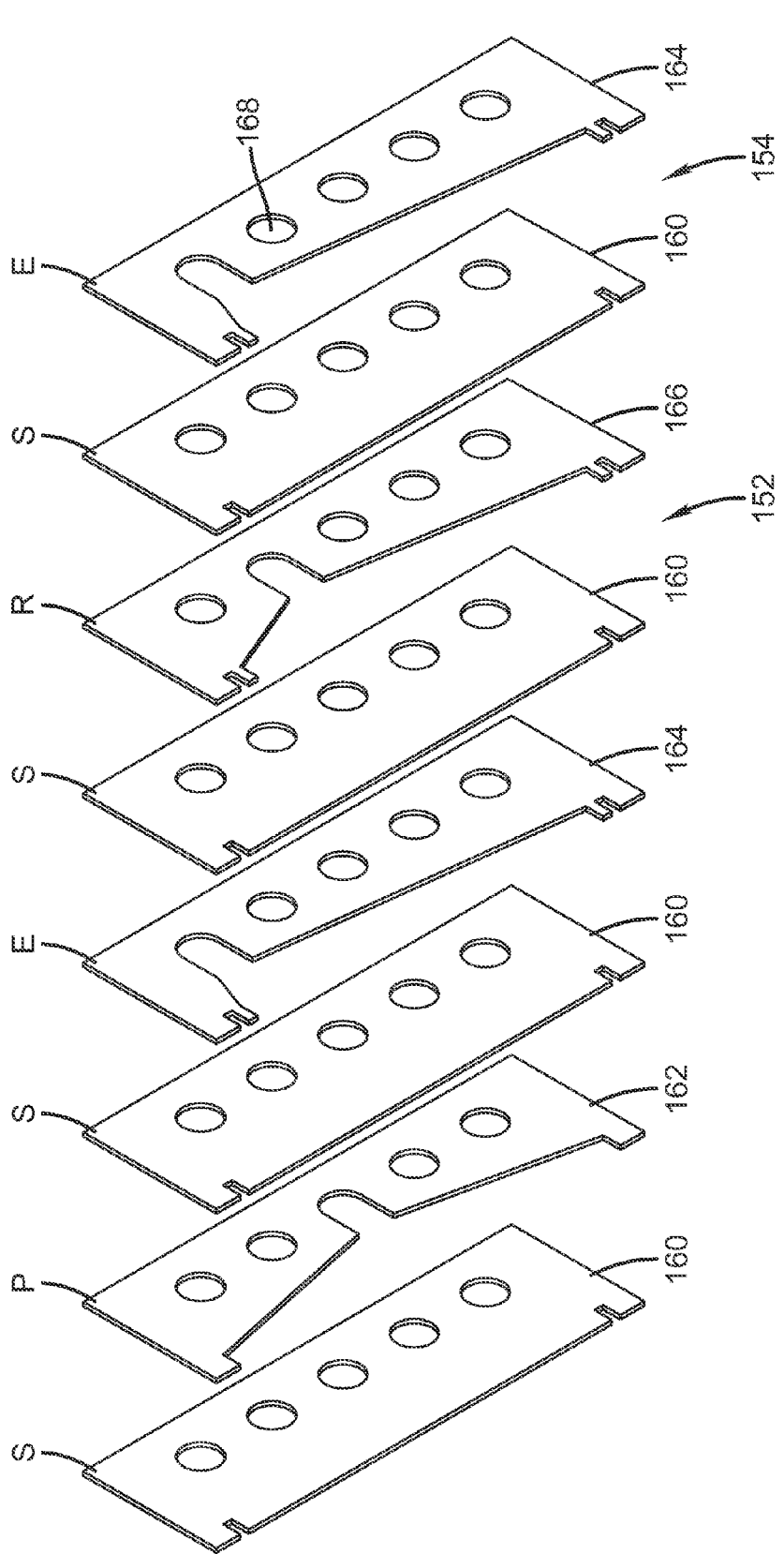
FIG. 9B is an exploded view of the components of the delivery device shown in FIG. 9A.

Referring to FIG. 9A, there is shown such an alternative embodiment, from a bottom view (that is, viewed from the gas emission side) an alternate arrangement that can be used for delivery assembly 150 using a stack of superposed apertured plates that are disposed perpendicularly with respect to output face 36. For simplicity of explanation, the portion of delivery assembly 150 shown in the "vertical" embodiment of FIG. 9A has two elongated emissive channels 152 and two elongated exhaust channels 154. The vertical plates arrangement of FIGS. 9A through 13C can be readily expanded to provide a number of elongated emissive and elongated exhaust channels. With apertured plates disposed perpendicularly with respect to the plane of output face 36, as in FIGS. 9A and 9B, each elongated emissive channel 152 is formed by having side walls defined by separator plates, shown subsequently in more detail, with a reactant plate centered between them. Proper alignment of apertures then provides fluid communication with the supply of gaseous material.

Figure 9C:
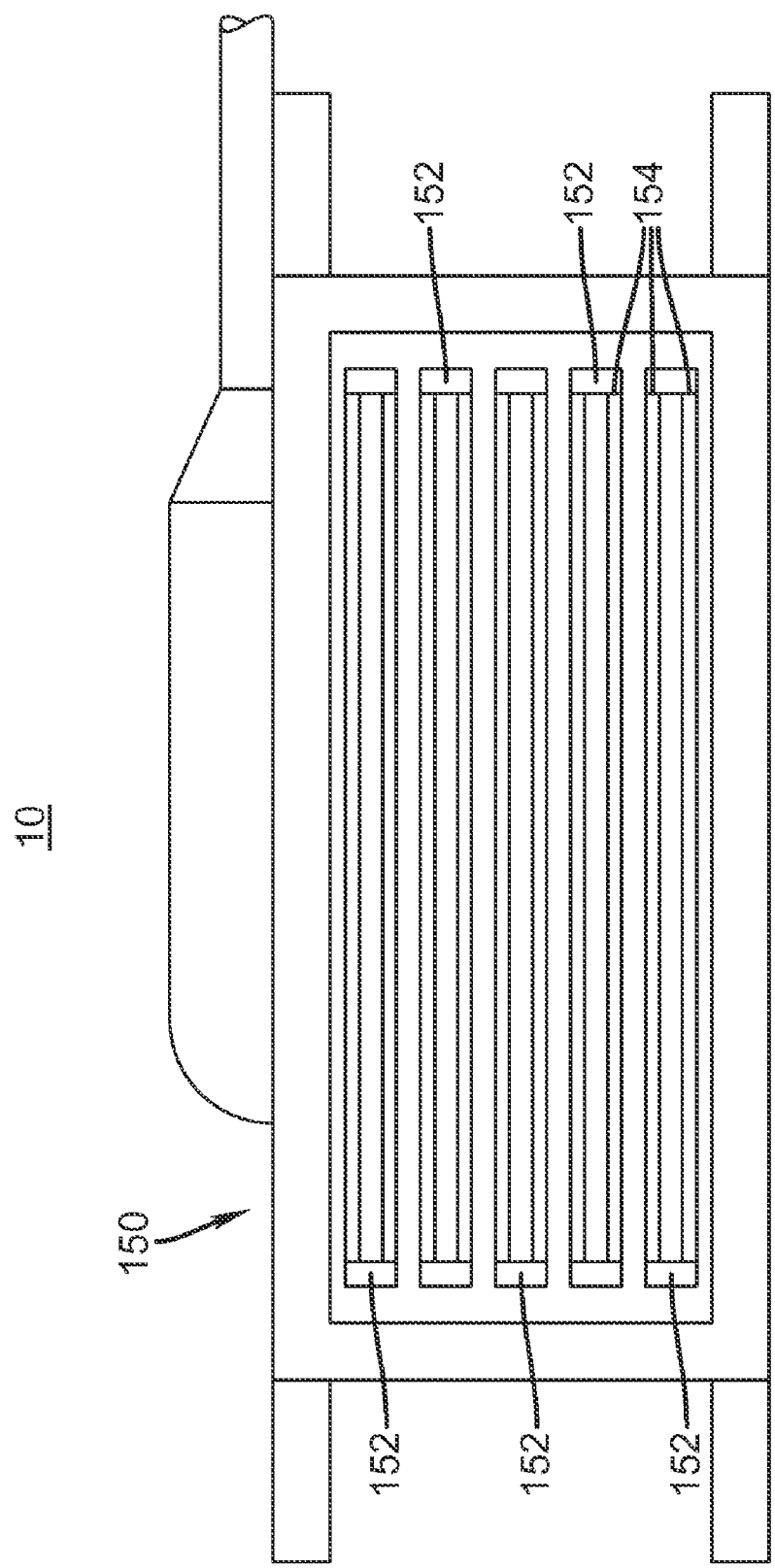
FIG. 9C is a plan view showing a delivery assembly formed using stacked plates.

The exploded view of FIG. 9B shows the arrangement of apertured plates used to form the small section of delivery assembly 150 that is shown in FIG. 9A. FIG. 9C is a plan view showing a delivery assembly 150 having five elongated channels for emitted gases and formed using apertured plates. FIGS. 10A through 13B then show the various apertured plates in both plan and perspective views. For simplicity, letter designations are given to each type of apertured plate: Separator S, Purge P, Reactant R, and Exhaust E.

Figure 10A:
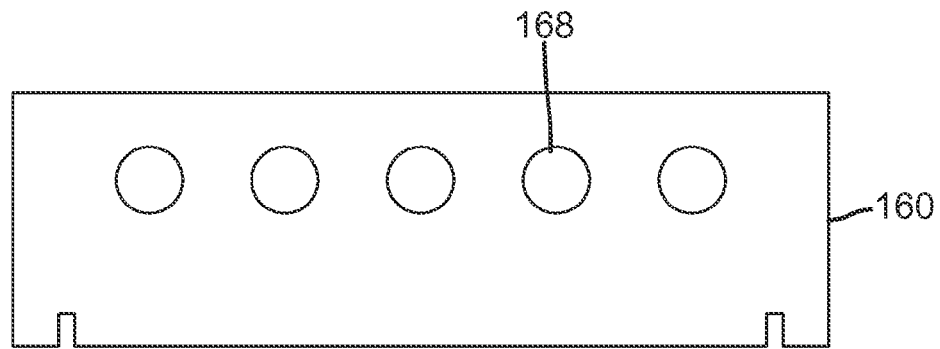
FIGS. 10A and 10B are plan and perspective views, respectively, of a separator plate used in the vertical plate embodiment of FIG. 9A.
Figure 10B:
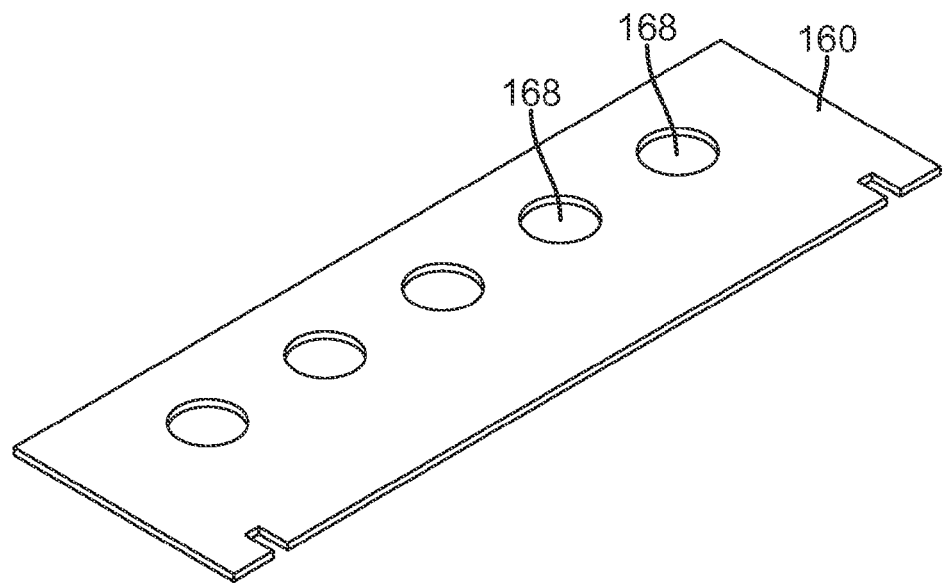
Figure 11A:
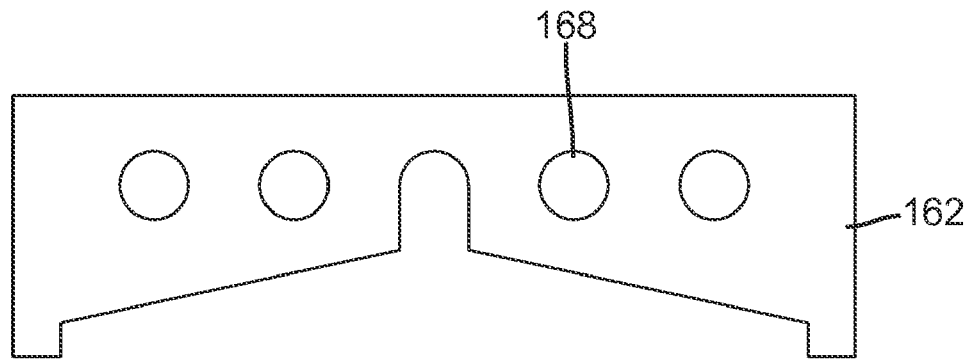
FIGS. 11A and 11B are plan and perspective views, respectively, of a purge plate used in the vertical plate embodiment of FIG. 9A.
Figure 11B:
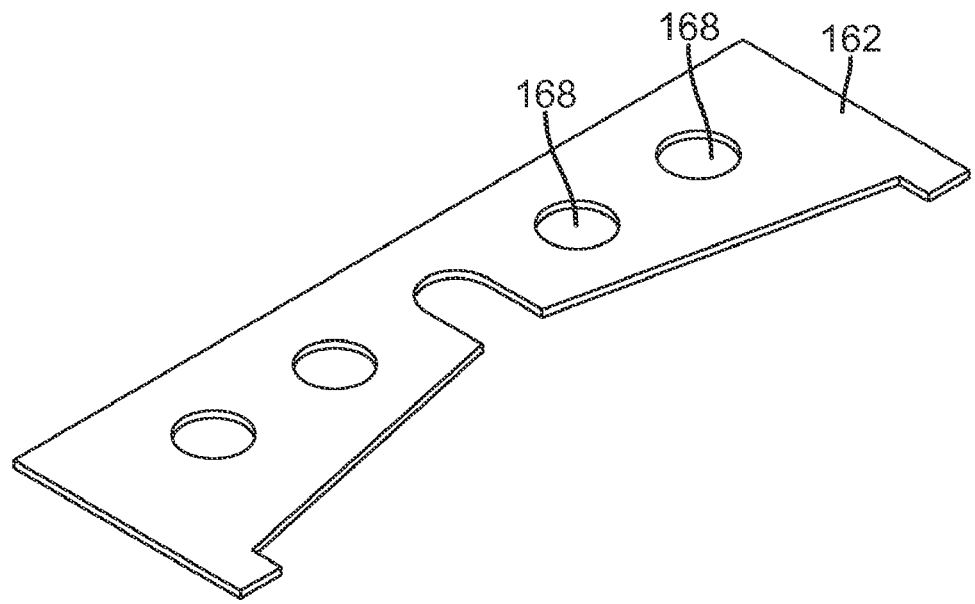
Figure 12A:
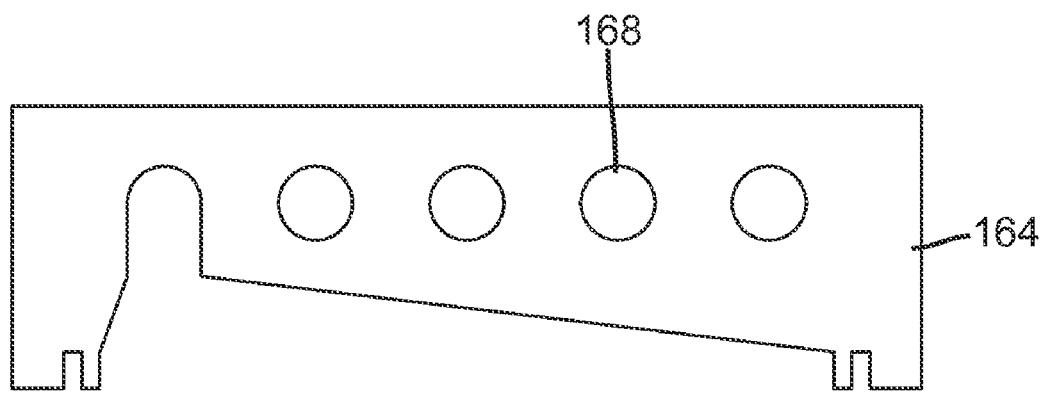
FIGS. 12A and 12B are plan and perspective views, respectively, of an exhaust plate used in the vertical plate embodiment of FIG. 9A.
Figure 12B:
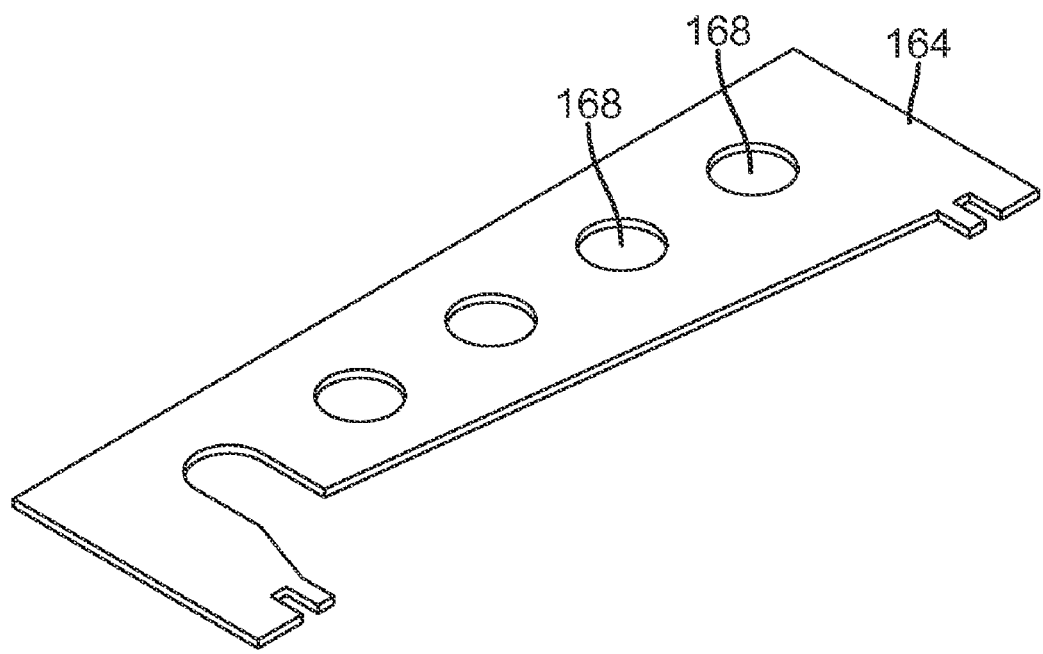
Figure 13A:
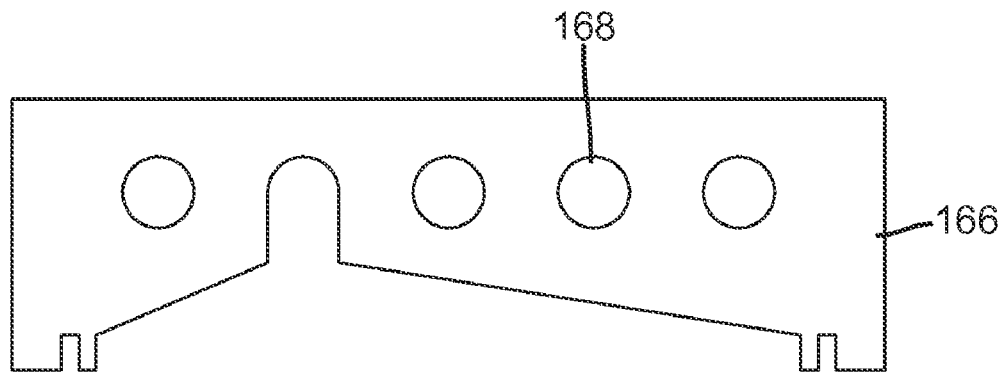
FIGS. 13A and 13B are plan and perspective views, respectively, of a reactant plate used in the vertical plate embodiment of FIG. 9A.
Figure 13B:
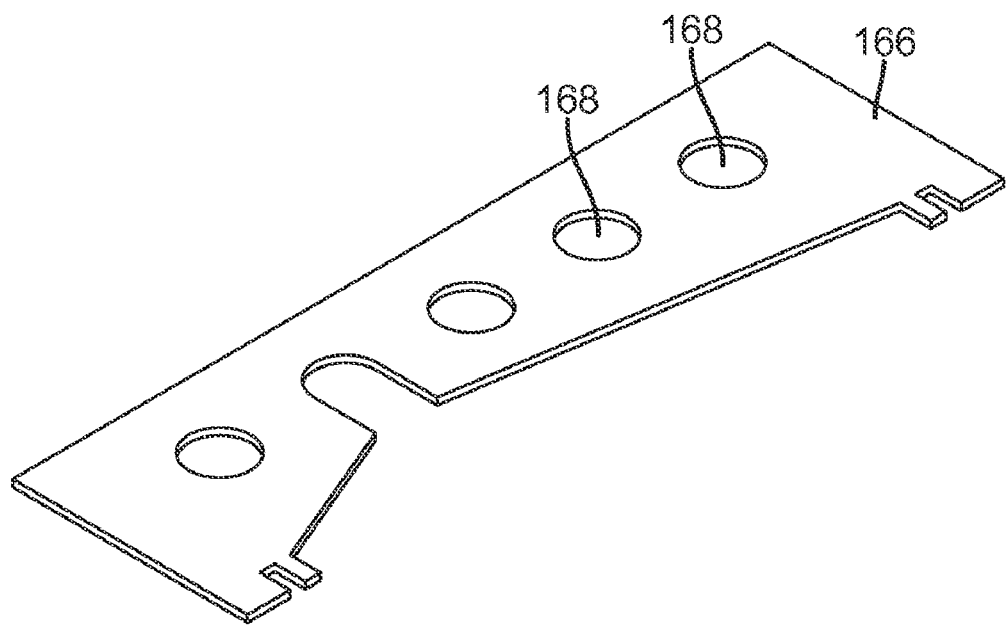
Figure 13C:
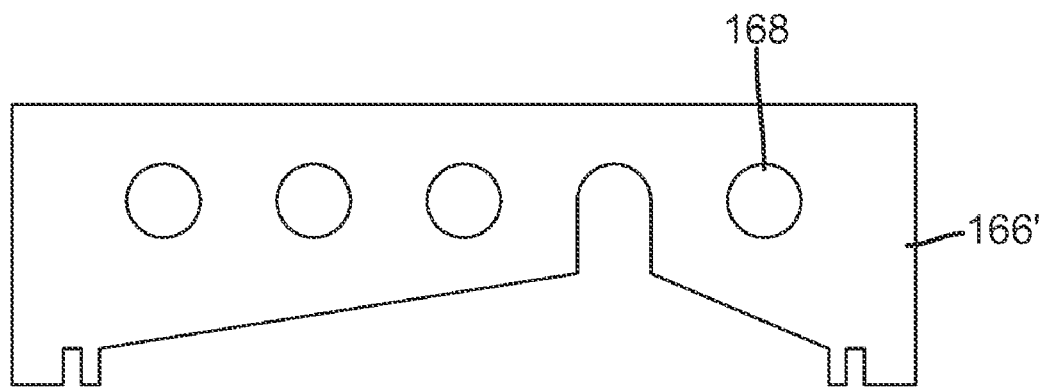
FIG. 13C is a plan view of a reactant plate in an alternate orientation.

From left to right in FIG. 9B are separator plates 160 (S), also shown in FIGS. 10A and 10B, alternating between plates used for directing gas toward or away from the substrate. A purge plate 162 (P) is shown in FIGS. 11A and 11B. An exhaust plate 164 (E) is shown in FIGS. 12A and 12B. A reactant plate 166 (R) is shown in FIGS. 13A and 13B. FIG. 13C shows a reactant plate 166' obtained by flipping the reactant plate 166 of FIG. 12A horizontally; this alternate orientation can also be used with exhaust plate 164, as required. Apertures 168 in each of the apertured plates align when the plates are superposed, thus forming ducts to enable gas to be passed through delivery assembly 150 into elongated emissive channels 152 and elongated exhaust channels 154, as were described with reference to FIG. 1.

Returning to FIG. 9B, only a portion of a delivery assembly 150 is shown. The plate structure of this portion can be represented using the sequence of letter abbreviations assigned earlier, that is:

S-P-S-E-S-R-S-E-(S)

(With the last separator plate in this sequence not shown in FIG. 9A or 9B.) As this sequence shows, separator plates 160 (S) define each channel by forming side walls. A minimal delivery assembly 150 for providing two reactive gases along with the necessary purge gases and exhaust channels for typical ALD deposition would be represented using the full abbreviation sequence:

S-P-S-E1-S-R1-S-E1-S-P-S-E2-S-R2-S-E2-S-P-S-E1-S-R1-S-E1-S-P-S-E2-S-R2-S-E2-S-P-S-E1-S-R1-S-E1-S-P-S where R1 and R2 represent reactant plates 166 in different orientations, for the two different reactant gases used, and E1 and E2 correspondingly represent exhaust plates 164 in different orientations.

Elongated exhaust channel 154 need not be a vacuum port, in the conventional sense, but may simply be provided to draw off the flow from its corresponding output channel 12, thus facilitating a uniform flow pattern within the channel. A negative draw, just slightly less than the opposite of the gas pressure at neighboring elongated emissive channels 152, can help to facilitate an orderly flow. The negative draw can, for example, operate with draw pressure at the source (for example, a vacuum pump) of between 0.2 and 1.0 atmosphere, whereas a typical vacuum is, for example, below 0.1 atmosphere.

Use of the flow pattern provided by delivery head 10 provides a number of advantages over conventional approaches, such as those noted earlier in the background section, that pulse gases individually to a deposition chamber. Mobility of the deposition apparatus improves, and the device of the present invention is suited to high-volume deposition applications in which the substrate dimensions exceed the size of the deposition head. Flow dynamics are also improved over earlier approaches.

The flow arrangement used in the present invention allows a very small distance D between delivery head 10 and substrate 20, as was shown in FIG. 1, preferably under 1 mm. Output face 36 can be positioned very closely, to within about 1 mil (approximately 0.025 mm) of the substrate surface. By comparison, earlier approaches such as that described in the U.S. Pat. No. 6,821,563 (Yudovsky), cited earlier, were limited to 0.5 mm or greater distance to the substrate surface, whereas embodiments of the present invention can be practice at less than 0.5 mm, for example, less than 0.450 mm. In fact, positioning the delivery head 10 closer to the substrate surface is preferred in the present invention. In a particularly preferred embodiment, distance D from the surface of the substrate can be 0.20 mm or less, preferably less than 100 µm.

It is desirable that when a large number of apertured plates are assembled in a stacked-plate embodiment, the gas flow delivered to the substrate is uniform across all of the channels delivering a gas flow (I, M, or 0 materials). This can be accomplished by proper design of the apertured plates, such as having restrictions in some part of the flow pattern for each plate which are accurately machined to provide a reproducible pressure drop for each elongated emissive output or exhaust channel. In one embodiment, output channels 12 exhibit substantially equivalent pressure along the length of the openings, to within no more than about 10% deviation. Even higher tolerances could be provided, such as allowing no more than about 5% or even as little as 2% deviation.

In one embodiment of the invention, the delivery head 10 of the present invention can be maintained a suitable separation distance D (FIG. 1) between its output face 36 and the surface of substrate 20, by using a floating system. FIG. 14 shows some considerations for maintaining distance D using the pressure of gas flows emitted from delivery head 10.

In FIG. 14, a representative number of output channels 12 and exhaust channels 22 are shown. The pressure of emitted gas from one or more of output channels 12 generates a force, as indicated by the downward arrow in this figure. In order for this force to provide a useful cushioning or "air" bearing (gas fluid bearing) effect for delivery head 10, there must be sufficient landing area, that is, solid surface area along output face 36 that can be brought into close contact with the substrate. The percentage of landing area corresponds to the relative amount of solid area of output face 36 that allows build-up of gas pressure beneath it. In simplest terms, the landing area can be computed as the total area of output face 36 minus the total surface area of output channels 12 and exhaust channels 22. This means that total surface area, excluding the gas flow areas of output channels 12, having a width w1, or of exhaust channels 22, having a width w2, must be maximized as much as possible. A landing area of 95% is provided in one embodiment. Other embodiments may use smaller landing area values, such as 85% or 75%, for example. Adjustment of gas flow rate could also be used in order to alter the separation or cushioning force and thus change distance D accordingly.

It can be appreciated that there would be advantages to providing a gas fluid bearing, so that delivery head 10 is substantially maintained at a distance D above substrate 20. This would allow essentially frictionless motion of delivery head 10 using any suitable type of transport mechanism. Delivery head 10 could then be caused to "hover" above the surface of substrate 20 as it is channeled back and forth, sweeping across the surface of substrate 20 during materials deposition.

As shown in FIG. 14, delivery head 10 may be too heavy, so that the downward gas force is not sufficient for maintaining the needed separation. In such a case, auxiliary lifting components, such as a spring 170, magnet, or other device, could be used to supplement the lifting force. In other cases, gas flow may be high enough to cause the opposite problem, so that delivery head 10 would be forced apart from the surface of substrate 20 by too great a distance, unless additional force is exerted. In such a case, spring 170 may be a compression spring, to provide the additional needed force to maintain distance D (downward with respect to the arrangement of FIG. 14). Alternately, spring 170 may be a magnet, elastomeric spring, or some other device that supplements the downward force.

Figure 20:
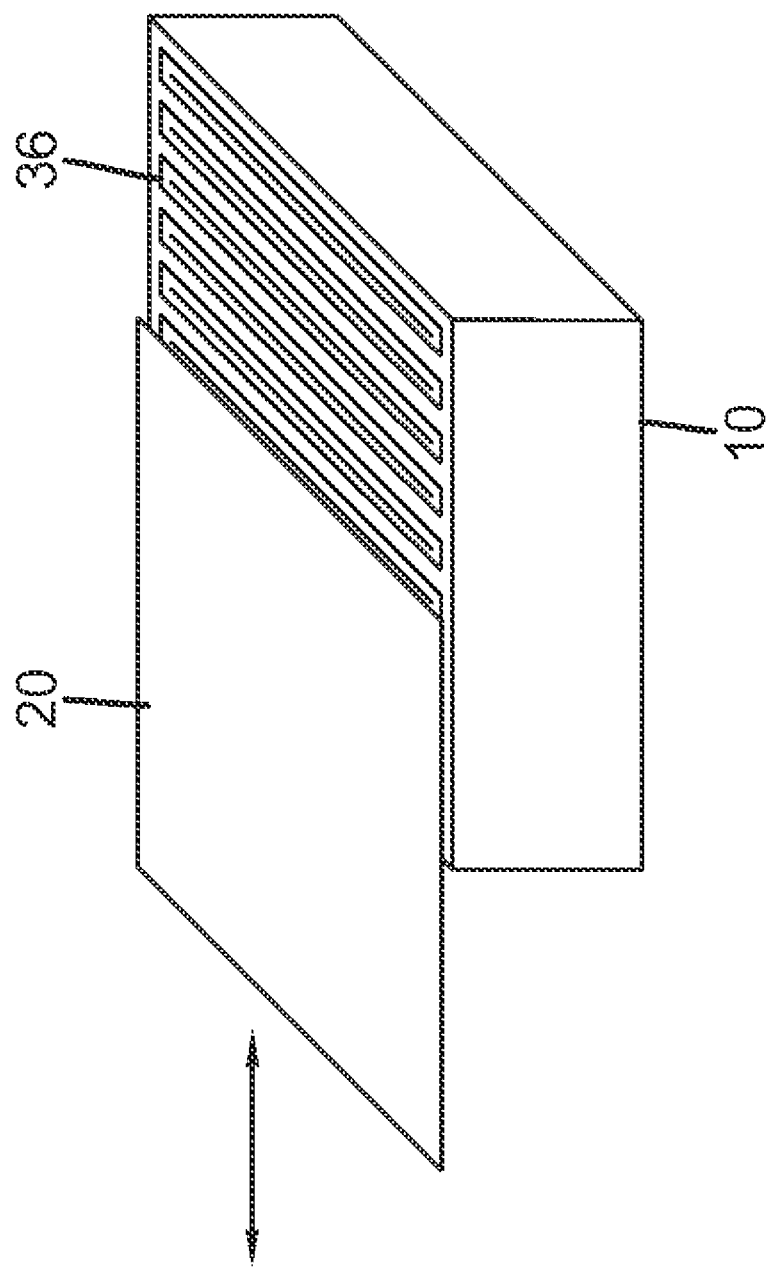
FIG. 20 is a perspective view of an embodiment using a gas cushion to separate the delivery device from the substrate.

Alternately, delivery head 10 may be positioned in some other orientation with respect to substrate 20. For example, substrate 20 could be supported by the gas fluid bearing effect, opposing gravity, so that substrate 20 can be moved along delivery head 10 during deposition. One embodiment using the gas fluid bearing effect for deposition onto substrate 20, with substrate 20 cushioned above delivery head 10 is shown in FIG. 20. Movement of substrate 20 across output face 36 of delivery head 10 is in a direction along the double arrow as shown.

Figure 21:
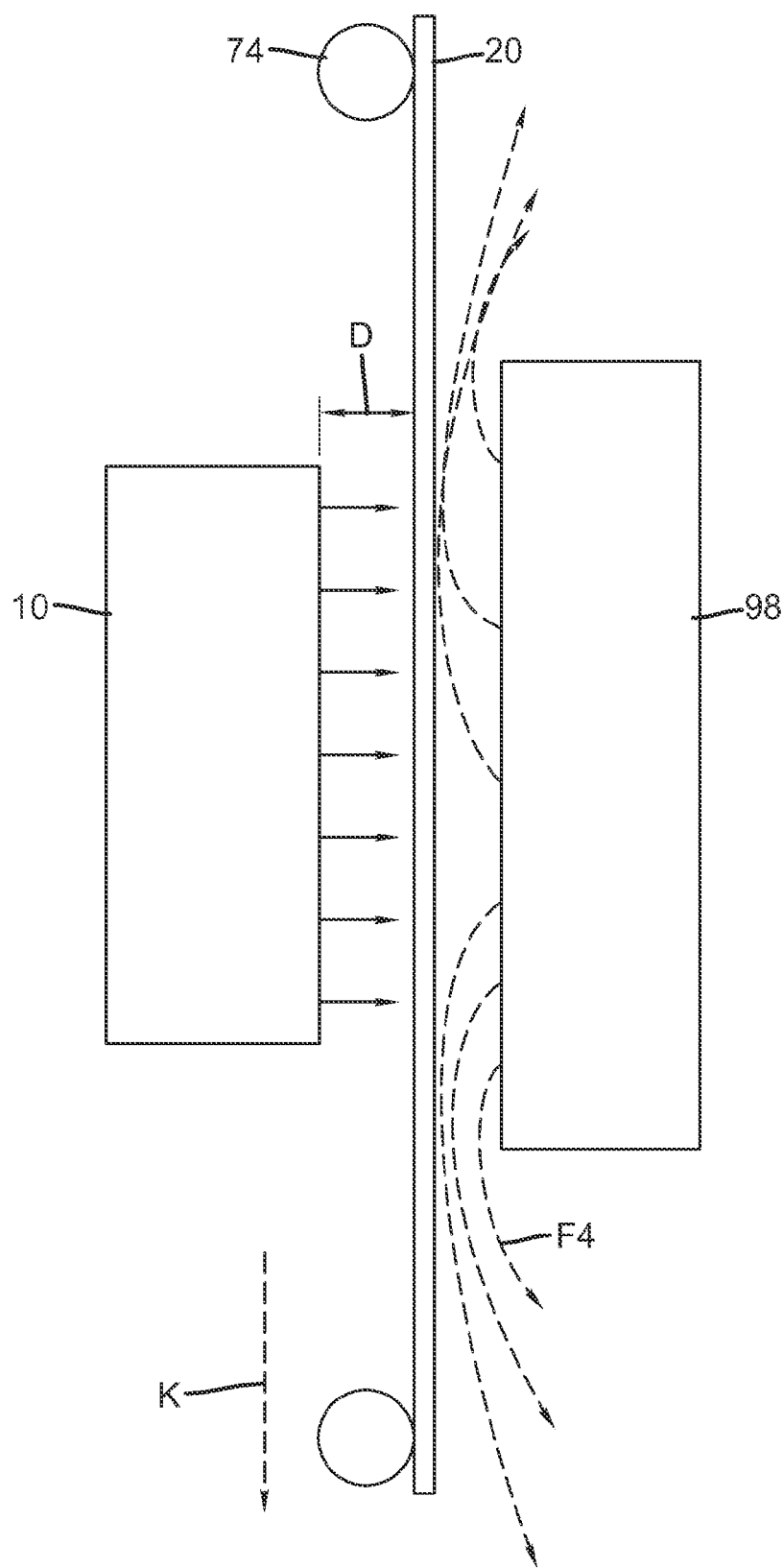
FIG. 21 is a side view showing an embodiment for a deposition system comprising an "air" bearing embodiment for use with a moving substrate.

The alternate embodiment of FIG. 21 shows substrate 20 on a substrate support 74, such as a web support or rollers, moving in direction K between delivery head 10 and a gas fluid bearing 98. In this case, air or another inert gas alone can be used. In this embodiment, delivery head 10 has an air-bearing effect and cooperates with gas fluid bearing 98 in order to maintain the desired distance D between output face 36 and substrate 20. Gas fluid bearing 98 may direct pressure using a flow F4 of inert gas, or air, or some other gaseous material. It is noted that, in the present deposition system, a substrate support or holder can be in contact with the substrate during deposition, which substrate support can be a means for conveying the substrate, for example a roller. Thus, thermal isolation of the substrate being treated is not a requirement of the present system.

As was particularly described with reference to FIGS. 3A and 3B, delivery head 10 requires movement relative to the surface of substrate 20 in order to perform its deposition function. This relative movement can be obtained in a number of ways, including movement of either or both delivery head 10 and substrate 20, such as by movement of an apparatus that provides a substrate support. Movement can be oscillating or reciprocating or could be continuous movement, depending on how many deposition cycles are needed. Rotation of a substrate can also be used, particularly in a batch process, although continuous processes are preferred. An actuator may be coupled to the body of the delivery device, such as mechanically connected. An alternating force, such as a changing magnetic force field, could alternately be used.

Typically, ALD requires multiple deposition cycles, building up a controlled film depth with each cycle. Using the nomenclature for types of gaseous materials given earlier, a single cycle can, for example in a simple design, provide one application of first reactant gaseous material O and one application of second reactant gaseous material M.

The distance between output channels for O and M reactant gaseous materials determines the needed distance for reciprocating movement to complete each cycle. For the example delivery head 10 of FIG. 4 may have a nominal channel width of 0.1 inches (2.54 mm) in width between a reactant gas channel outlet and the adjacent purge channel outlet. Therefore, for the reciprocating motion (along the y axis as used herein) to allow all areas of the same surface to see a full ALD cycle, a stroke of at least 0.4 inches (10.2 mm) would be required. For this example, an area of substrate 20 would be exposed to both first reactant gaseous material O and second reactant gaseous material M with movement over this distance. Alternatively, a delivery device can move much larger distances for its stroke, even moving from one end of a substrate to another. In this case the growing film may be exposed to ambient conditions during periods of its growth, causing no ill effects in many circumstances of use. In some cases, consideration for uniformity may require a measure of randomness to the amount of reciprocating motion in each cycle, such as to reduce edge effects or build-up along the extremes of reciprocation travel.

A delivery head 10 may have only enough output channels 12 to provide a single cycle. Alternately, delivery head 10 may have an arrangement of multiple cycles, enabling it to cover a larger deposition area or enabling its reciprocating motion over a distance that allows two or more deposition cycles in one traversal of the reciprocating motion distance.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

Figure 15:
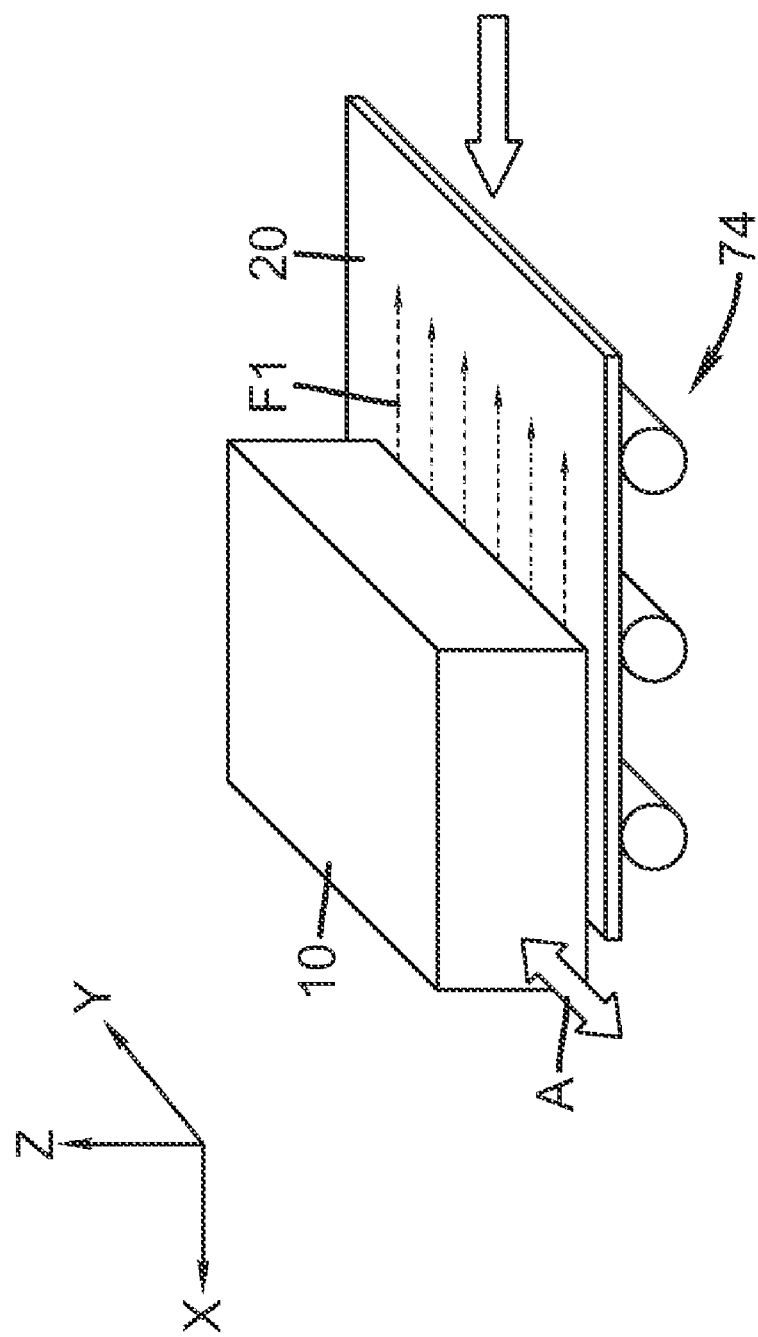
FIG. 15 is a perspective view showing a distribution head used with a substrate transport system.

An advantage of the reciprocating motion used for a delivery head 10 of the present invention is that it allows deposition onto a substrate 20 whose area exceeds the area of output face 36. FIG. 15 shows schematically how this broader area coverage can be effected, using reciprocating motion along the y axis as shown by arrow A and also movement orthogonal or transverse to the reciprocating motion, relative to the x axis. Again, it must be emphasized that motion in either the x or y direction, as shown in FIG. 15, can be effected either by movement of delivery head 10, or by movement of substrate 20 provided with a substrate support 74 that provides movement, or by movement of both delivery head 10 and substrate 20.

In FIG. 15 the relative motion directions of the delivery device, and the substrate are perpendicular to each other. It is also possible to have this relative motion in parallel. In this case, the relative motion needs to have a nonzero frequency component that represents the oscillation and a zero frequency component that represents the displacement of the substrate. This combination can be achieved by: an oscillation combined with displacement of the delivery device over a fixed substrate; an oscillation combined with displacement of the substrate relative to a fixed substrate delivery device; or any combinations wherein the oscillation and fixed motion are provided by movements of both the delivery device and the substrate.

Advantageously, delivery head 10 can be fabricated at a smaller size than is possible for many types of deposition heads. For example, in one embodiment, output channel 12 has width w1 of about 0.005 inches (0.127 mm) and is extended in length to about 3 inches (75 mm).

In a preferred embodiment, ALD can be performed at or near atmospheric pressure and over a broad range of ambient and substrate temperatures, preferably at a temperature of under 300° C. Preferably, a relatively clean environment is needed to minimize the likelihood of contamination; however, full "clean room" conditions or an inert gas-filled enclosure would not be required for obtaining good performance when using preferred embodiments of the apparatus of the present invention.

Figure 16:
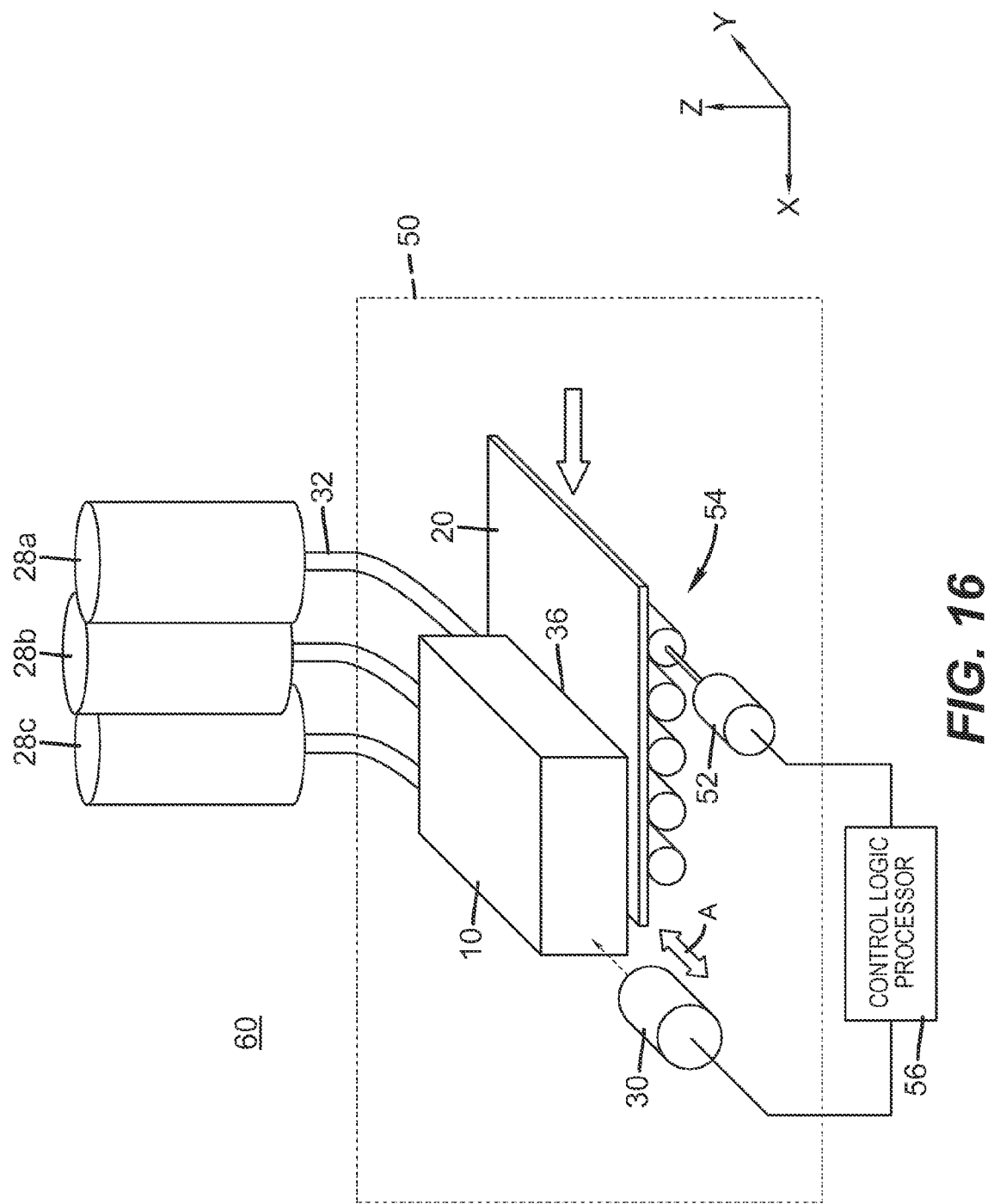
FIG. 16 is a perspective view showing a deposition system using the delivery device of the present invention.

FIG. 16 shows an atomic layer deposition (ALD) system 60 having a chamber 50 for providing a relatively well-controlled and contaminant-free environment. Gas supplies 28a, 28b, and 28c provide the first, second, and third gaseous materials to delivery head 10 through supply lines 32. The optional use of flexible supply lines 32 facilitates ease of movement of delivery head 10. For simplicity, optional vacuum vapor recovery apparatus and other support components are not shown in FIG. 16 but could also be used. A transport subsystem 54 provides a substrate support that conveys substrate 20 along output face 36 of delivery head 10, providing movement in the x direction, using the coordinate axis system employed in the present disclosure. Motion control, as well as overall control of valves and other supporting components, can be provided by a control logic processor 56, such as a computer or dedicated microprocessor assembly, for example. In the arrangement of FIG. 16, control logic processor 56 controls an actuator 30 for providing reciprocating motion to delivery head 10 and also controls a transport motor 52 of transport subsystem 54. Actuator 30 can be any of a number of devices suitable for causing back-and-forth motion of delivery head 10 along a moving substrate 20 (or, alternately, along a stationary substrate 20).

Figure 17:
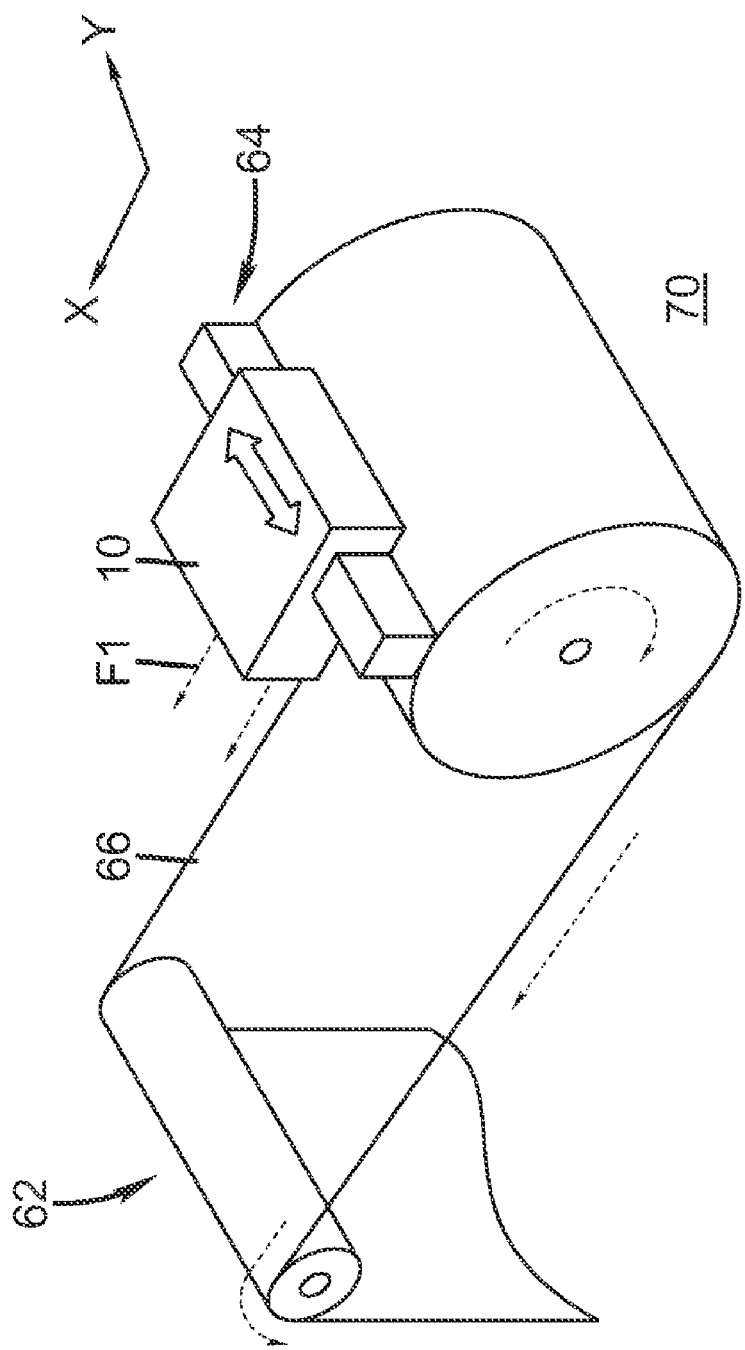
FIG. 17 is a perspective view showing one embodiment of a deposition system applied to a moving web.

FIG. 17 shows an alternate embodiment of an atomic layer deposition (ALD) system 70 for thin film deposition onto a web substrate 66 that is conveyed past delivery head 10 along a web conveyor 62 that acts as a substrate support. A delivery device transport 64 conveys delivery head 10 across the surface of web substrate 66 in a direction transverse to the web travel direction. In one embodiment, delivery head 10 is impelled back and forth across the surface of web substrate 66, with the full separation force provided by gas pressure. In another embodiment, delivery device transport 64 uses a lead screw or similar mechanism that traverses the width of web substrate 66. In another embodiment, multiple delivery devices 10 are used, at suitable positions along web conveyor 62.

Figure 18:
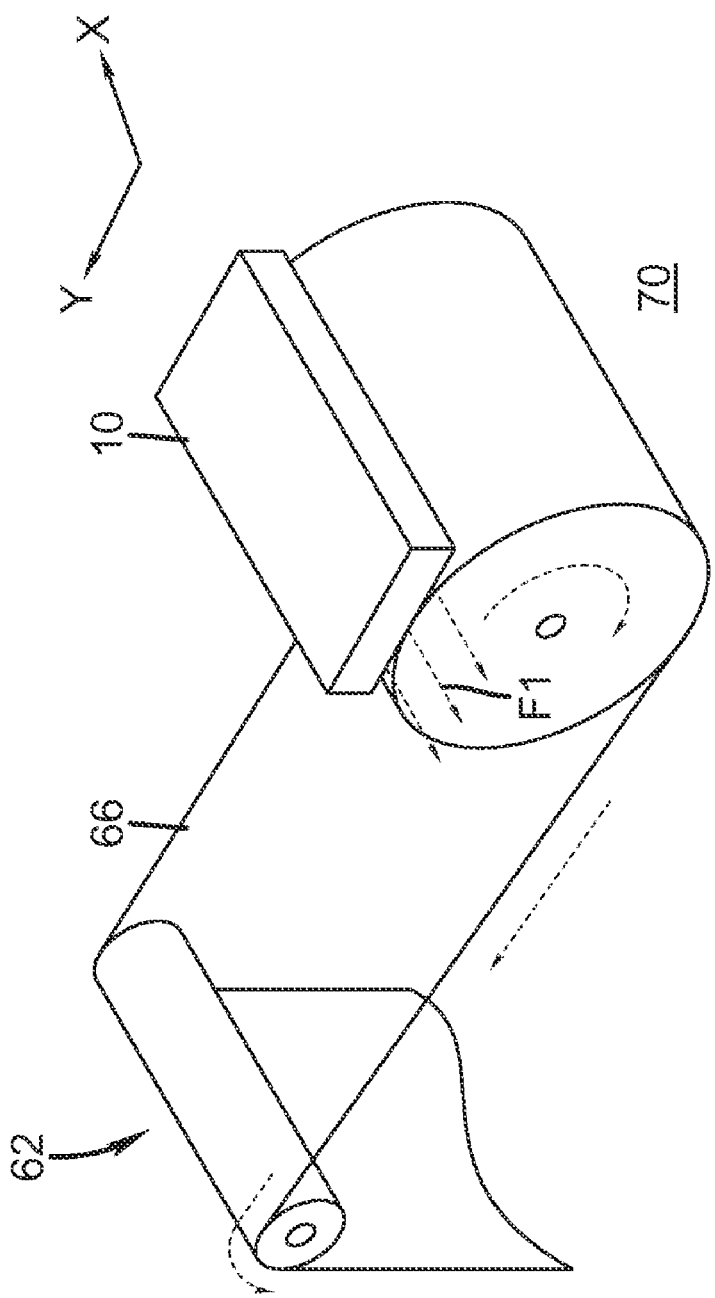
FIG. 18 is a perspective view showing another embodiment of deposition system applied to a moving web.
Figure 19:
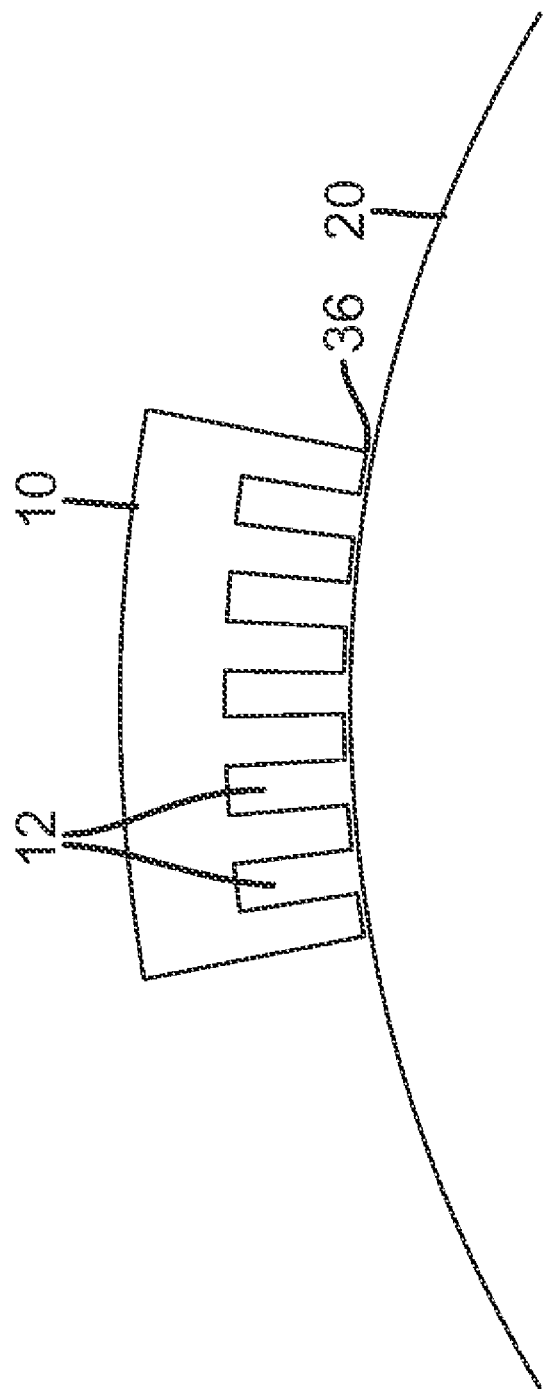
FIG. 19 is a cross-sectional side view of one embodiment of a delivery device with an output face having curvature.

FIG. 18 shows another atomic layer deposition (ALD) system 70 in a web arrangement, using a stationary delivery head 10 in which the flow patterns are oriented orthogonally to the configuration of FIG. 17. In this arrangement, motion of web conveyor 62 itself provides the movement needed for ALD deposition. Reciprocating motion could also be used in this environment. Referring to FIG. 19, an embodiment of a portion of delivery head 10 is shown in which output face 36 has an amount of curvature, which might be advantageous for some web coating applications. Convex or concave curvature could be provided.

In another embodiment that can be particularly useful for web fabrication, ALD system 70 can have multiple delivery devices 10, or dual delivery devices 10, with one disposed on each side of web substrate 66. A flexible delivery head 10 could alternately be provided. This would provide a deposition apparatus that exhibits at least some conformance to the deposition surface.

The apparatus of the present invention is advantaged in its capability to perform deposition onto a substrate over a broad range of temperatures, including room or near-room temperature in some embodiments. The apparatus of the present invention can operate in a vacuum environment, but is particularly well suited for operation at or near atmospheric pressure.

Thin film transistors having a semiconductor film made according to the present method can exhibit a field effect electron mobility that is greater than 0.01 $cm^2/Vs$, preferably at least 0.1 $cm^2/Vs$, more preferably greater than 0.2 $cm^2/Vs$. In addition, n-channel thin film transistors having semiconductor films made according to the present invention are capable of providing on/off ratios of at least $10^4$, advantageously at least $10^5$. The on/off ratio is measured as the maximum/minimum of the drain current as the gate voltage is swept from one value to another that are representative of relevant voltages which might be used on the gate line of a display. A typical set of values would be −10V to 40V with the drain voltage maintained at 30V.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while air bearing effects may be used to at least partially separate delivery head 10 from the surface of substrate 20, the apparatus of the present invention may alternately be used to lift or levitate substrate 20 from output surface 36 of delivery head 10. Other types of substrate holder could alternately be used, including a platen for example.

Apertured plates used for delivery head 10 could be formed and coupled together in a number of ways. Advantageously, apertured plates can be separately fabricated, using known methods such as progressive die, molding, machining, or stamping. Particularly desirable methods for forming the intricate openings on the apertured plates are wire electrical discharge machining (wire EDM) or photolithographic techniques. Combinations of apertured plates can vary widely from those shown in the embodiments of FIGS. 4, 9A, and 9B, forming delivery head 10 with any number of plates, such as from 5 to 100 plates. Stainless steel is used in one embodiment and is advantageous for its resistance to chemicals and corrosion. Generally, apertured plates are metallic, although ceramic, glass, or other durable materials may also be suitable for forming some or all of the apertured plates, depending on the application and on the reactant gaseous materials that are used in the deposition process.

For assembly, apertured plates can be glued or coupled together using mechanical fasteners, such as bolts, clamps, or screws. For sealing, apertured plates can be skin-coated with suitable adhesive or sealant materials, such as vacuum grease. Epoxy, such as a high-temperature epoxy, can be used as an adhesive. Adhesive properties of melted polymer materials such as polytetrafluoroethylene (PTFE) or TEFLON have also been used to bond together superposed apertured plates for delivery head 10. In one embodiment, a coating of PTFE is formed on each of the apertured plates used in delivery head 10. The plates are stacked (superposed) and compressed together while heat is applied near the melting point of the PTFE material (nominally 327 degrees C.). The combination of heat and pressure then forms delivery head 10 from the coated apertured plates. The coating material acts both as an adhesive and as a sealant. Kapton and other polymer materials could alternately be used as interstitial coating materials for adhesion.

As shown in FIGS. 4 and 9B, apertured plates must be assembled together in the proper sequence for forming the network of interconnecting supply chambers and directing channels that route gaseous materials to output face 36. When assembled together, a fixture providing an arrangement of alignment pins or similar features could be used, where the arrangement of orifices and slots in the apertured plates mate with these alignment features.

The above described method and apparatus can be used to deposit thin film material layers on a variety of substrates. One example of a substrate can be the OLED device described in the U.S. patent application Ser. No. 11/861,539 filed Sep. 26, 2007, which is incorporated herein by reference in its entirety. Such OLED device has an encapsulation package consisting of multilayers of inorganic materials including, for example, zinc oxide and aluminium oxide deposited interchangeably. This inorganic multilayer stack can be optimized to yield maximum light transmission, provide anti-glare or anti-reflection coatings over the display, or provide colored, neutral density, or color conversion filters over the display. Separate layers of filters, polarizers and anti-glare or anti-reflection coatings may be specifically provided over the encapsulation package or included as a pre-designed characteristic of the encapsulation package, especially in the case of a multilayer thin film.

The above described method and apparatus are one example of the vapor deposition process that can be used in the present invention to produce thin film material layers in the form of interference filter.

EXAMPLES

In the example thin film material coatings were carried out using apparatus similar to that described above. Alumina or zinc oxide were coated. For alumina, a 1M solution of trimethylaluminum in heptane was in one bubbler and water in the other. For zinc oxide, diethylzinc 15 wt. % solution in hexane was in one bubbler and water was in the other bubbler.

For all oxides, the flow rate of the carrier gas through the bubblers was 50 ml/min. The flow rate of diluting carrier gas was 300 ml/min for the water reactant. The flow rate of the inert separator gas was 2 l/min. Nitrogen was used for the carrier gas in all instances. A calibration was run to determine the thickness versus number of substrate oscillations for the oxides. The substrate temperature was ~220 Celcius.

Example 1

An interference filter was created by depositing layers of zinc oxide and alumina interchangeably on a 62×62×1 mm glass slide using ALD system. The aim thicknesses of the layers were in order from the substrate up:

| | |
|---|---|
| Zinc oxide | 100 nm |
| Alumina | 100 nm |
| Zinc oxide | 100 nm |
| Alumina | 100 nm |
| Zinc oxide | 100 nm |
| Alumina | 200 nm |
| Zinc oxide | 100 nm |
| Alumina | 100 nm |
| Zinc oxide | 100 nm |
| Alumina | 100 nm |
| Zinc oxide | 100 nm |

Figure 22A:
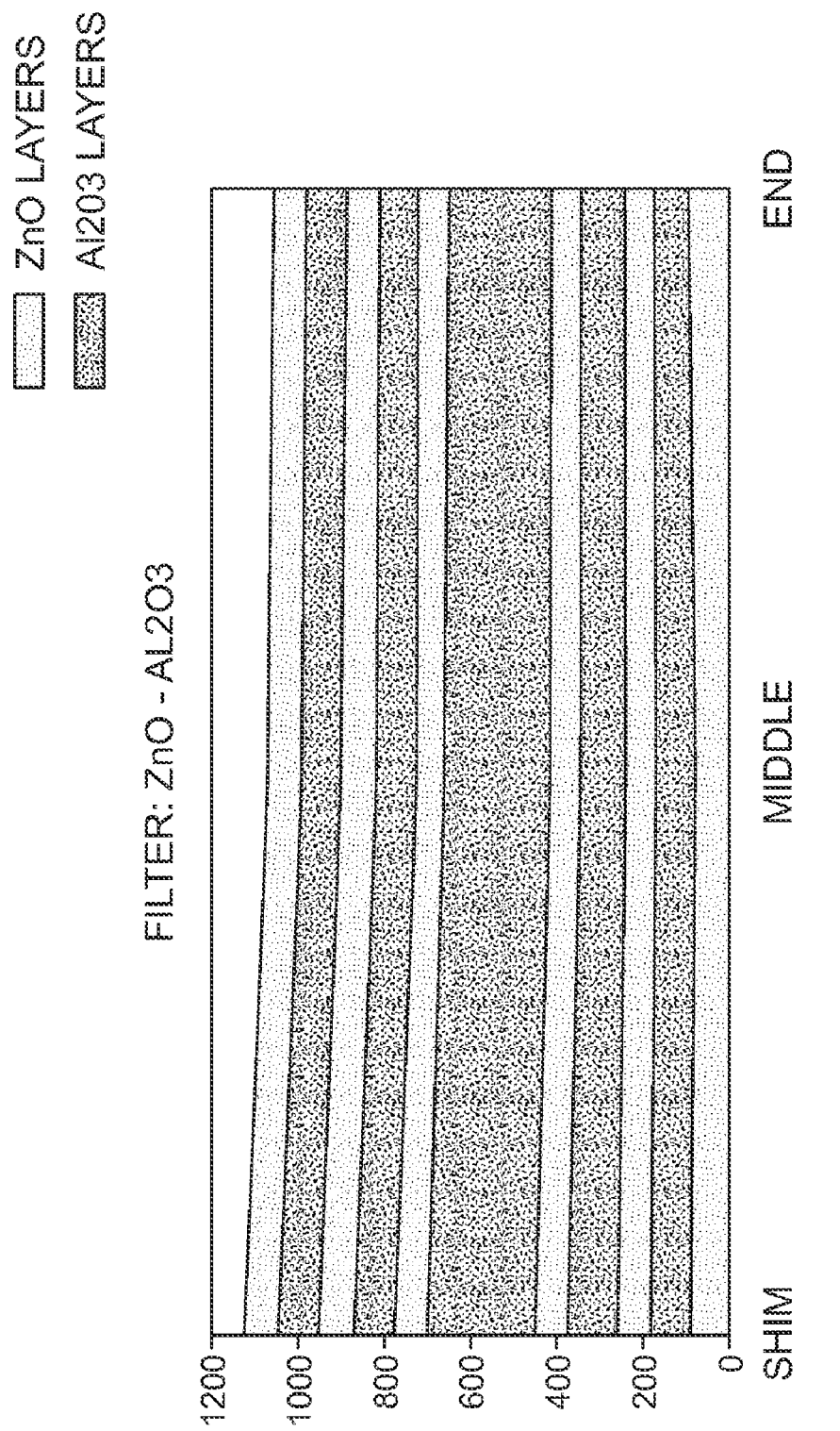
FIGS. 22A and 22B illustrate an optical filter produced using the deposition operation and its absorbance.
Figure 22B:
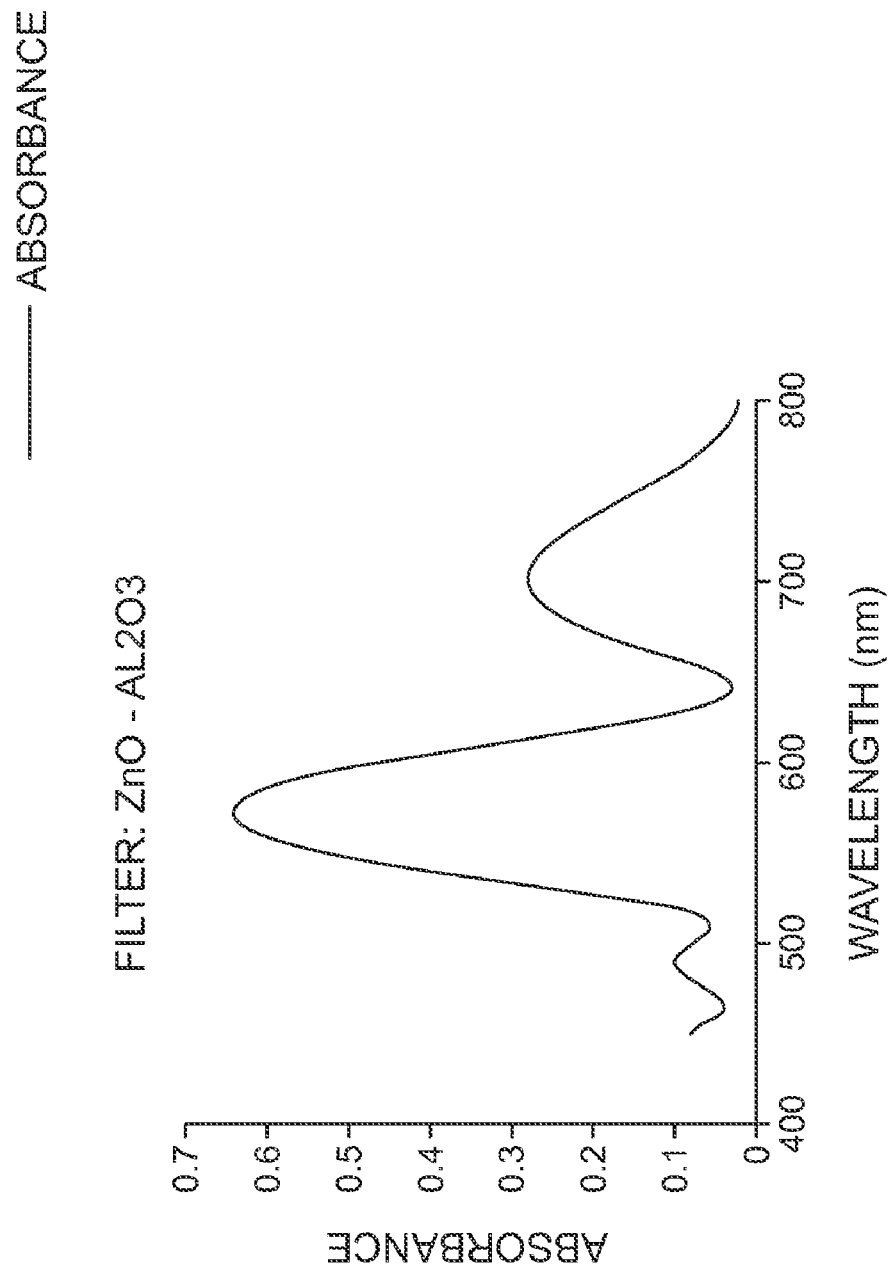

The diagram of the filter layers is shown in FIG. 22a. The absorbance of the filter was measured showing the peaks near 570 nm and around 700 nm which is shown in FIG. 22b.

The invention has been described in detail with reference to preferred embodiments thereof. It will be understood by those skilled in the art that variations and modifications can be effected within the scope of the invention.

PARTS LIST

| | |
|---|---|
| 10 | delivery head |
| 12 | output channel |
| 14 | gas inlet conduit |
| 16 | gas inlet conduit |
| 18 | gas inlet conduit |
| 20 | substrate |
| 22 | exhaust channel |
| 24 | exhaust port conduit |
| 28a | gas supply |
| 28b | gas supply |
| 28c | gas supply |
| 30 | actuator |
| 32 | supply line |
| 36 | output face |
| 50 | chamber |
| 52 | transport motor |
| 54 | transport subsystem |
| 56 | control logic processor |
| 60 | atomic layer deposition (ALD) system |
| 62 | web conveyor |
| 64 | delivery device transport |
| 66 | web substrate |
| 70 | atomic layer deposition (ALD) system |
| 74 | substrate support |
| 90 | directing channel for precursor material |
| 92 | directing channel for purge gas |
| 96 | substrate support |
| 98 | gas fluid bearing |
| 100 | connection plate |
| 102 | directing chamber |
| 104 | input port |
| 110 | gas chamber plate |
| 112 | supply chamber |
| 113 | supply chamber |
| 115 | supply chamber |
| 114 | exhaust chamber |
| 116 | exhaust chamber |
| 120 | gas direction plate |
| 122 | directing channel for precursor material |
| 123 | exhaust directing channel |
| 130 | base plate |
| 132 | elongated emissive channel |
| 134 | elongated exhaust channel |
| 140 | gas diffuser unit |
| 142 | nozzle plate |
| 143 | first diffuser output passage |
| 146 | gas diffuser plate |
| 147 | second diffuser output passage |
| 148 | face plate |
| 149 | third diffuser output passage |
| 150 | delivery assembly |
| 152 | elongated emissive channel |
| 154 | elongated exhaust channel |
| 160 | separator plate |
| 162 | purge plate |
| 164 | exhaust plate |
| 166 | reactant plate |
| 166' | reactant plate |
| 168 | aperture |
| 170 | spring |
| 180 | sequential first exhaust slot |
| 182 | sequential second exhaust slot |
| 184 | sequential third exhaust slot |
| A | arrow |
| D | distance |
| E | exhaust plate |
| F1 | gas flow |
| F2 | gas flow |
| F3 | gas flow |
| F4 | gas flow |
| I | third inert gaseous material |
| K | direction |
| M | second reactant gaseous material |
| O | first reactant gaseous material |
| P | purge plate |
| R | reactant plate |
| S | separator plate |
| w1 | channel width |
| w2 | channel width |
| X | arrow |

The invention claimed is:

1. A process of making a thin film electronic device comprising:
   providing an electronic device on a substrate;
   providing a plurality of gaseous material sources including a first source of a first reactant gaseous material, a second source of a second reactant gaseous material, and a third source of a inert gaseous material;
   providing a delivery head in fluid communication with the gaseous material sources through a plurality of inlet ports, the first gaseous material source being connected to a first inlet port, the second gaseous material source being connected to a second inlet port, the third gaseous material source being connected to a third inlet port, the delivery head including an output face and a first plurality of elongated substantially parallel emissive channels connected in fluid communication with the first inlet port, a second plurality of elongated substantially parallel emissive channels connected to a second inlet port, and a third plurality of elongated substantially parallel emissive channels connected to a third inlet port, at least one of the third elongated emissive channels being positioned to separate at least one of the first elongated emissive channels and at least one of the second elongated emissive channels;

causing one or more of the first reactant gaseous material, the second reactant gaseous material, and the inert gaseous material to flow through the first elongated emissive channel, the second elongated emissive channel, and the third elongated emissive channel, respectively, of the delivery head, the flow including a pressure, the pressure generated by the flow of the one or more of the first reactant gaseous material, the second reactant gaseous material, and the third inert gaseous materials creating a gas fluid bearing that maintains a substantially uniform distance between the output face of the delivery head and the substrate;

simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate; and causing a relative motion between the delivery head and the substrate to cause the second reactant gaseous material to react with at least a portion of the electronic device and a portion of the substrate that has been treated with the first reactant gaseous material to create a thin film over at least the portion of the electronic device and the portion of the substrate that has been treated with the first reactant gaseous material, wherein creating the gas fluid bearing includes causing the delivery head to float above the substrate.

2. The process of claim 1, wherein the materials of the first reactant gaseous material and the second reactant gaseous material are chosen to provide the electronic device with a thin film that provides a selected optical property.

3. The process of claim 2, wherein the materials of the first reactant gaseous material and the second reactant gaseous material are chosen to provide the electronic device with a thin film that provides an environmental barrier layer.

4. The process of claim 1, the thin film being a first thin film, the process further comprising:
creating a second thin film over the first thin film by substituting one of the first reactant gaseous material and the second reactant gaseous material with a third reactant gaseous material.

5. The process of claim 4, wherein the materials of the third reactant gaseous material and the remaining first or second reactant gaseous material are chosen to provide the electronic device with a thin film that provides a selected optical property.

6. The process of claim 4, wherein the materials of the third reactant gaseous material and the remaining first or second reactant gaseous material are chosen to provide the electronic device with a thin film that provides an environmental barrier layer.

7. The process of claim 1, the thin film being a first thin film, the process further comprising:
creating a second thin film over the first thin film by substituting the first reactant gaseous material with a third reactant gaseous material and substituting the second reactant gaseous material with a fourth reactant gaseous material.

8. The process of claim 7, wherein the materials of the third reactant gaseous material and the fourth reactant gaseous material are chosen to provide the electronic device with a thin film that provides a selected optical property.

9. The process of claim 7, wherein the materials of the third reactant gaseous material and the fourth reactant gaseous material are chosen to provide the electronic device with a thin film that provides an environmental barrier layer.

10. A process of making a thin film electronic device comprising:
providing an electronic device on a substrate;
providing a plurality of gaseous material sources including a first source of a first reactant gaseous material, a second source of a second reactant gaseous material, and a third source of a inert gaseous material;
providing a delivery head in fluid communication with the gaseous material sources through a plurality of inlet ports, the first gaseous material source being connected to a first inlet port, the second gaseous material source being connected to a second inlet port, the third gaseous material source being connected to a third inlet port, the delivery head including an output face and a first plurality of elongated substantially parallel emissive channels connected in fluid communication with the first inlet port, a second plurality of elongated substantially parallel emissive channels connected to a second inlet port, and a third plurality of elongated substantially parallel emissive channels connected to a third inlet port, at least one of the third elongated emissive channels being positioned to separate at least one of the first elongated emissive channels and at least one of the second elongated emissive channels;

causing one or more of the first reactant gaseous material, the second reactant gaseous material, and the inert gaseous material to flow through the first elongated emissive channel, the second elongated emissive channel, and the third elongated emissive channel, respectively, of the delivery head, the flow including a pressure, the pressure generated by the flow of the one or more of the first reactant gaseous material, the second reactant gaseous material, and the third inert gaseous materials creating a gas fluid bearing that maintains a substantially uniform distance between the output face of the delivery head and the substrate;

simultaneously directing the first reactant gaseous material, the second reactant gaseous material, and the inert gaseous material to flow through the first elongated emissive channel, the second elongated emissive channel, and the third elongated emissive channel, respectively, of the delivery head toward the electronic device and the substrate; and causing a relative motion between the delivery head and the substrate to cause the second reactant gaseous material to react with at least a portion of the electronic device and a portion of the substrate that has been treated with the first reactant gaseous material to create a thin film over at least the portion of the electronic device and the portion of the substrate that has been treated with the first reactant gaseous material, wherein creating the gas fluid bearing includes causing the substrate to levitate above the delivery head.

11. The process of claim 10, wherein the materials of the first reactant gaseous material and the second reactant gaseous material are chosen to provide the electronic device with a thin film that provides a selected optical property.

12. The process of claim 10, wherein the materials of the first reactant gaseous material and the second reactant gaseous material are chosen to provide the electronic device with a thin film that provides an environmental barrier layer.

13. The process of claim 10, the thin film being a first thin film, the process further comprising:
   creating a second thin film over the first thin film by substituting one of the first reactant gaseous material and the second reactant gaseous material with a third reactant gaseous material.

14. The process of claim 13, wherein the materials of the third reactant gaseous material and the remaining first or second reactant gaseous material are chosen to provide the electronic device with a thin film that provides a selected optical property.

15. The process of claim 13, wherein the materials of the third reactant gaseous material and the remaining first or second reactant gaseous material are chosen to provide the electronic device with a thin film that provides an environmental barrier layer.

16. The process of claim 10, the thin film being a first thin film, the process further comprising:
   creating a second thin film over the first thin film by substituting the first reactant gaseous material with a third reactant gaseous material and substituting the second reactant gaseous material with a fourth reactant gaseous material.

17. The process of claim 16, wherein the materials of the third reactant gaseous material and the fourth reactant gaseous material are chosen to provide the electronic device with a thin film that provides a selected optical property.

18. The process of claim 16, wherein the materials of the third reactant gaseous material and the fourth reactant gaseous material are chosen to provide the electronic device with a thin film that provides an environmental barrier layer.

* * * * *